US012620441B2

(12) United States Patent
Zhao et al.

(10) Patent No.: US 12,620,441 B2
(45) Date of Patent: May 5, 2026

(54) MEMORY, OPERATION METHOD OF MEMORY, AND MEMORY SYSTEM

(71) Applicant: YANGTZE MEMORY TECHNOLOGIES CO., LTD., Wuhan (CN)

(72) Inventors: XiangNan Zhao, Wuhan (CN); SongMin Jiang, Wuhan (CN); Tingze Wang, Wuhan (CN); Chenhui Li, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 145 days.

(21) Appl. No.: 18/750,641

(22) Filed: Jun. 21, 2024

(65) Prior Publication Data

US 2025/0329388 A1     Oct. 23, 2025

(30) Foreign Application Priority Data

Apr. 17, 2024     (CN) ........................ 202410468938.X

(51) Int. Cl.
| | |
|---|---|
| *G11C 16/34* | (2006.01) |
| *G11C 16/04* | (2006.01) |
| *G11C 16/10* | (2006.01) |
| *G11C 16/26* | (2006.01) |

(52) U.S. Cl.
CPC .......... *G11C 16/10* (2013.01); *G11C 16/0483* (2013.01); *G11C 16/26* (2013.01)

(58) Field of Classification Search
CPC ..................................................... G11C 16/34
See application file for complete search history.

(56) References Cited

U.S. PATENT DOCUMENTS

2023/0274784 A1*   8/2023   Tokutomi ............ G06F 11/1068
365/185.03

* cited by examiner

*Primary Examiner* — Jason Lappas
(74) *Attorney, Agent, or Firm* — Conley Rose, P.C.

(57)     ABSTRACT

A memory includes a memory array and a peripheral circuit, wherein the memory array includes memory cells; the memory cells include a plurality of first memory cells coupled with a first selected word line, and a plurality of second memory cells coupled with a second selected word line; and the peripheral circuit is configured to: acquire a grouping result of the plurality of second memory cells, and if a first memory cell is coupled with a second memory cell in a first group through a first bit line, apply a first read voltage to the first memory cell at a first read duration; and if a first memory cell is coupled with a second memory cell in a second group through a second bit line, apply a second read voltage to the first memory cell at a second read duration.

20 Claims, 17 Drawing Sheets

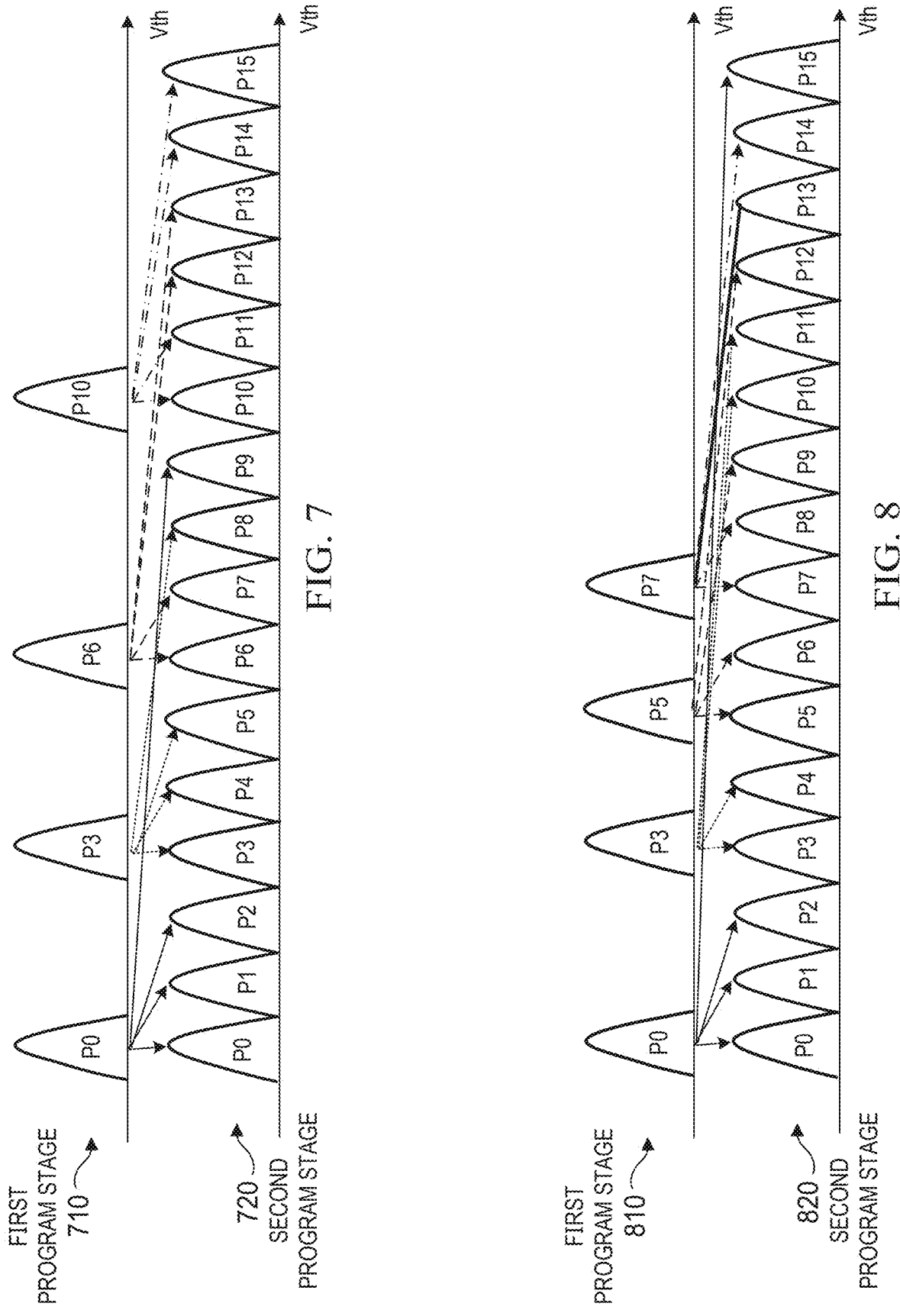

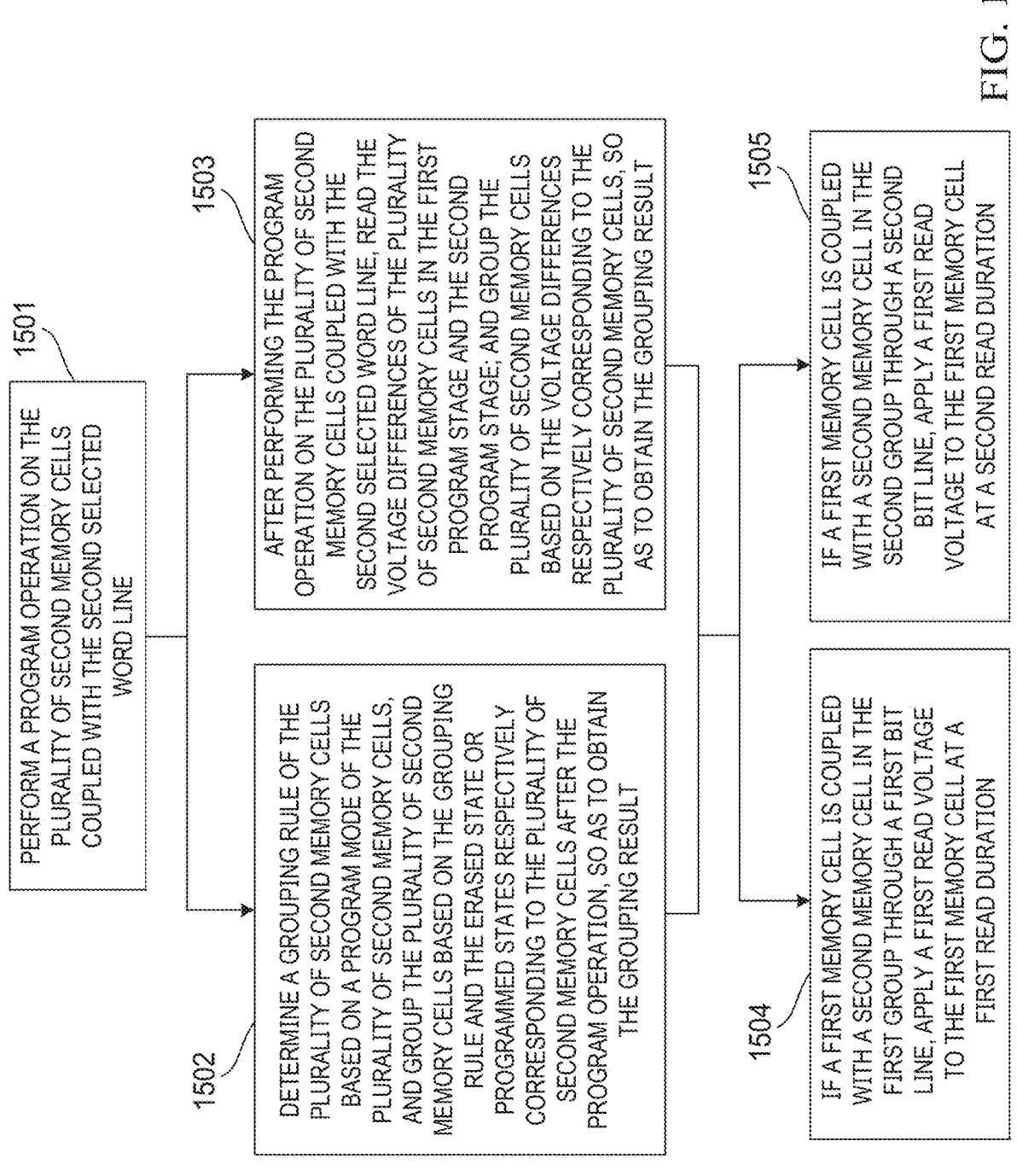

PERFORM A PROGRAM OPERATION ON THE PLURALITY OF SECOND MEMORY CELLS COUPLED WITH THE SECOND SELECTED WORD LINE — 1501

DETERMINE A GROUPING RULE OF THE PLURALITY OF SECOND MEMORY CELLS BASED ON A PROGRAM MODE OF THE PLURALITY OF SECOND MEMORY CELLS, AND GROUP THE PLURALITY OF SECOND MEMORY CELLS BASED ON THE GROUPING RULE AND THE ERASED STATE OR PROGRAMMED STATES RESPECTIVELY CORRESPONDING TO THE PLURALITY OF SECOND MEMORY CELLS AFTER THE PROGRAM OPERATION, SO AS TO OBTAIN THE GROUPING RESULT — 1502

AFTER PERFORMING THE PROGRAM OPERATION ON THE PLURALITY OF SECOND MEMORY CELLS COUPLED WITH THE SECOND SELECTED WORD LINE, READ THE VOLTAGE DIFFERENCES OF THE PLURALITY OF SECOND MEMORY CELLS IN THE FIRST PROGRAM STAGE AND THE SECOND PROGRAM STAGE; AND GROUP THE PLURALITY OF SECOND MEMORY CELLS BASED ON THE VOLTAGE DIFFERENCES RESPECTIVELY CORRESPONDING TO THE PLURALITY OF SECOND MEMORY CELLS, SO AS TO OBTAIN THE GROUPING RESULT — 1503

IF A FIRST MEMORY CELL IS COUPLED WITH A SECOND MEMORY CELL IN THE FIRST GROUP THROUGH A FIRST BIT LINE, APPLY A FIRST READ VOLTAGE TO THE FIRST MEMORY CELL AT A FIRST READ DURATION — 1504

IF A FIRST MEMORY CELL IS COUPLED WITH A SECOND MEMORY CELL IN THE SECOND GROUP THROUGH A SECOND BIT LINE, APPLY A FIRST READ VOLTAGE TO THE FIRST MEMORY CELL AT A SECOND READ DURATION — 1505

FIG. 15

MEMORY, OPERATION METHOD OF MEMORY, AND MEMORY SYSTEM

CROSS-REFERENCE TO RELATED APPLICATIONS

The present application claims priority to Chinese Patent Application No. 202410468938X, which was filed Apr. 17, 2024, is titled "MEMORY, MEMORY OPERATING METHOD AND STORAGE SYSTEM," and is hereby incorporated herein by reference in its entirety.

TECHNICAL FIELD

The present application relates to the technical field of memories, and particularly to a memory, an operation method of a memory, and a memory system.

BACKGROUND

A 3-Dimension (3D) memory comprises a plurality of memory cells, and according to the volume of data that can be stored by the memory cells, the types of the memory cells can be classified into a Single-Level Cell (SLC), a Multi-Level Cell (MLC), a Trinary-Level Cell (TLC), and a Quad-Level Cell (QLC), etc.

SUMMARY

The present application provides a memory, an operation method of a memory, and a memory system. The technical solutions are as follows:

One aspect provides a memory. The memory comprises a memory array and a peripheral circuit, wherein the memory array comprises memory cells; the memory cells comprise a plurality of first memory cells coupled with a first selected word line, and a plurality of second memory cells coupled with a second selected word line, wherein the first selected word line and the second selected word line are adjacent to each other in terms of word line distribution structure; and the peripheral circuit is configured to: after performing a program operation on the plurality of second memory cells coupled with the second selected word line, acquire a grouping result of the plurality of second memory cells, wherein the grouping result comprises a first group and a second group, the program operation comprises a first program stage and a second program stage, and voltage differences of the second memory cells in the first group in the first program stage and the second program stage are less than voltage differences of the second memory cells in the second group in the first program stage and the second program stage;

if a first memory cell is coupled with a second memory cell in the first group through a first bit line, apply a first read voltage to the first memory cell at a first read duration; and if a first memory cell is coupled with a second memory cell in the second group through a second bit line, apply a second read voltage to the first memory cell at a second read duration.

In some examples, the peripheral circuit is further configured to:

determine a grouping rule of the plurality of second memory cells based on a program mode of the plurality of second memory cells, wherein the grouping rule comprises groups corresponding to an erased state and programmed states; and group the plurality of second memory cells based on the grouping rule and the erased state or programmed states corresponding respectively to the plurality of second memory cells after the program operation, so as to obtain the grouping result.

In some examples, the peripheral circuit is further configured to:

after performing the program operation on the plurality of second memory cells coupled with the second selected word line, read the erased state or programmed states corresponding respectively to the plurality of second memory cells; and group the plurality of second memory cells based on the erased state or programmed states corresponding respectively to the plurality of second memory cells and based on the groups corresponding to the erased state and each programmed state in the grouping rule, so as to obtain the grouping result.

In some examples, the peripheral circuit is further configured to:

after performing the program operation on the plurality of second memory cells coupled with the second selected word line, read the voltage differences of the plurality of second memory cells in the first program stage and the second program stage; and group the plurality of second memory cells based on the voltage differences corresponding respectively to the plurality of second memory cells, so as to obtain the grouping result.

In some examples, the peripheral circuit is further configured to:

when the voltage difference of a second memory cell in the first program stage and the second program stage is less than a voltage difference threshold, determine that the second memory cell belongs to the first group; or when the voltage difference of a second memory cell in the first program stage and the second program stage reaches the voltage difference threshold, determine that the second memory cell belongs to the second group.

In some examples, the first read duration is shorter than the second read duration, and the first read voltage and the second read voltage are the same; or the first read duration and the second read duration are the same; the first read voltage is a voltage that is obtained by performing a first offset operation between a reference voltage and a first offset voltage; the second read voltage is a voltage that is obtained by performing a second offset operation between the reference voltage and a second offset voltage; and the first read voltage is less than the second read voltage.

In some examples, the peripheral circuit is further configured to:

in the first program stage, perform a first program operation on the plurality of first memory cells coupled with the first selected word line to obtain n programmed states;

in the first program stage, perform the first program operation on the plurality of second memory cells coupled with the second selected word line to obtain n programmed states;

in the second program stage, perform a second program operation on the plurality of first memory cells coupled with the first selected word line to obtain m programmed states, wherein n and m are positive integers, and n≤m; and

in the second program stage, perform the second program operation on the plurality of second memory cells coupled with the second selected word line to obtain m programmed states.

In some examples, the peripheral circuit is further configured to:

store the grouping result of the plurality of second memory cells to a latch; and if a first memory cell is coupled with a second memory cell through the first bit line, acquire, from the latch, the group to which the second memory cell belongs.

Another aspect provides an operation method of a memory. The memory comprises a plurality of first memory cells coupled with a first selected word line, and a plurality of second memory cells coupled with a second selected word line, wherein the first selected word line and the second selected word line are adjacent to each other in terms of word line distribution structure; and the method comprises:

after performing a program operation on the plurality of second memory cells, acquiring a grouping result of the plurality of second memory cells, wherein the grouping result comprises a first group and a second group, the program operation comprises a first program stage and a second program stage, and voltage differences of the second memory cells in the first group in the first program stage and the second program stage are less than voltage differences of the second memory cells in the second group in the first program stage and the second program stage; and if a first memory cell is coupled with a second memory cell in the first group through a first bit line, applying a first read voltage to the first memory cell at a first read duration; or if the first memory cell is coupled with a second memory cell in the second group through a second bit line, applying a second read voltage to the first memory cell at a second read duration.

In some examples, the acquiring the grouping result of the plurality of second memory cells comprises:

determining a grouping rule of the plurality of second memory cells based on a program mode of the plurality of second memory cells, wherein the grouping rule comprises groups corresponding to an erased state and programmed states; and grouping the plurality of second memory cells based on the grouping rule and the erased state or programmed states corresponding respectively to the plurality of second memory cells after the program operation, so as to obtain the grouping result.

In some examples, the grouping the plurality of second memory cells based on the grouping rule and the erased state or programmed states corresponding respectively to the plurality of second memory cells after the program operation, so as to obtain the grouping result comprises:

after performing the program operation on the plurality of second memory cells coupled with the second selected word line, reading the erased state or programmed states corresponding respectively to the plurality of second memory cells; and grouping the plurality of second memory cells based on the erased state or programmed states corresponding respectively to the plurality of second memory cells and based on the groups corresponding to the erased state and each programmed state in the grouping rule, so as to obtain the grouping result.

In some examples, the acquiring the grouping result of the plurality of second memory cells comprises:

after performing the program operation on the plurality of second memory cells coupled with the second selected word line, reading the voltage differences of the plurality of second memory cells in the first program stage and the second program stage; and grouping the plurality of second memory cells based on the voltage differences corresponding respectively to the plurality of second memory cells, so as to obtain the grouping result.

In some examples, the grouping the plurality of second memory cells based on the voltage differences corresponding respectively to the plurality of second memory cells, so as to obtain the grouping result comprises:

when the voltage difference of a second memory cell in the first program stage and the second program stage is less than a voltage difference threshold, determining that the second memory cell belong to the first group; or when the voltage difference of a second memory cells in the first program stage and the second program stage reaches the voltage difference threshold, determining that the second memory cell belong to the second group.

In some examples, the first read duration is shorter than the second read duration, and the first read voltage and the second read voltage are the same; or the first read duration and the second read duration are the same; the first read voltage is a voltage that is obtained by performing a first offset operation between a reference voltage and a first offset voltage; and the second read voltage is a voltage that is obtained by performing a second offset operation between the reference voltage and a second offset voltage.

In some examples, the first program stage comprises a first program operation, and the second program stage comprises a second program operation; and the method further comprises:

performing the first program operation on the plurality of first memory cells coupled with the first selected word line to obtain n programmed states;

performing the first program operation on the plurality of second memory cells coupled with the second selected word line to obtain n programmed states;

performing the second program operation on the plurality of first memory cells coupled with the first selected word line to obtain m programmed states, wherein n and m are positive integers, and n≤m; and performing the second program operation on the plurality of second memory cells coupled with the second selected word line to obtain m programmed states.

In some examples, the method further comprises:

storing the grouping result of the plurality of second memory cells to a latch; and if a first memory cell is coupled with a second memory cell through the first bit line, acquiring, from the latch, the group to which the second memory cell belongs.

Another aspect provides a memory system. The memory system comprises:

one or more memories described in any one of the above-mentioned examples; and a memory controller coupled to the memory and configured to control the memory.

The technical solutions provided by the present application may comprise the following beneficial effects:

After the selected word lines are programmed, since WLn+1 has interlayer interference with WLn among the word lines whose positions are adjacent to each other, the WLn+1 is grouped based on the erased state and the programmed state, and is grouped into at least two groups for a state having relatively-large impact on the WLn and a state having relatively-small impact on the WLn. The read duration and voltage for the first memory cells are determined according to the first memory cells coupled with the WLn, and the groups to which the second memory cells coupled with the first memory cells through the BL belong, which amounts to increasing a threshold voltage width of the first memory cells, and improving the reliability of programming and the reliability of reading.

BRIEF DESCRIPTION OF THE DRAWINGS

The drawings to be used in description of examples will be briefly introduced below in order to illustrate the technical solutions in the examples of the present application more clearly. Apparently, the drawings described below are only some examples of the present application. Those of ordinary skill in the art may obtain other drawings according to these drawings without creative work.

FIGS. 5 to 10 are schematic diagrams of program voltages corresponding to different program modes provided by an example of the present application;

FIG. 15 is a flow diagram of an operation method of a memory provided by another example of the present application;

DETAILED DESCRIPTION

Implementations of the present application are further described in detail below with reference to the drawings.

An operation method of a memory provided by examples of the present application may be applied to memories. The memory may be a 3D memory, for example, may be a 3D NAND flash.

Figure 1A:
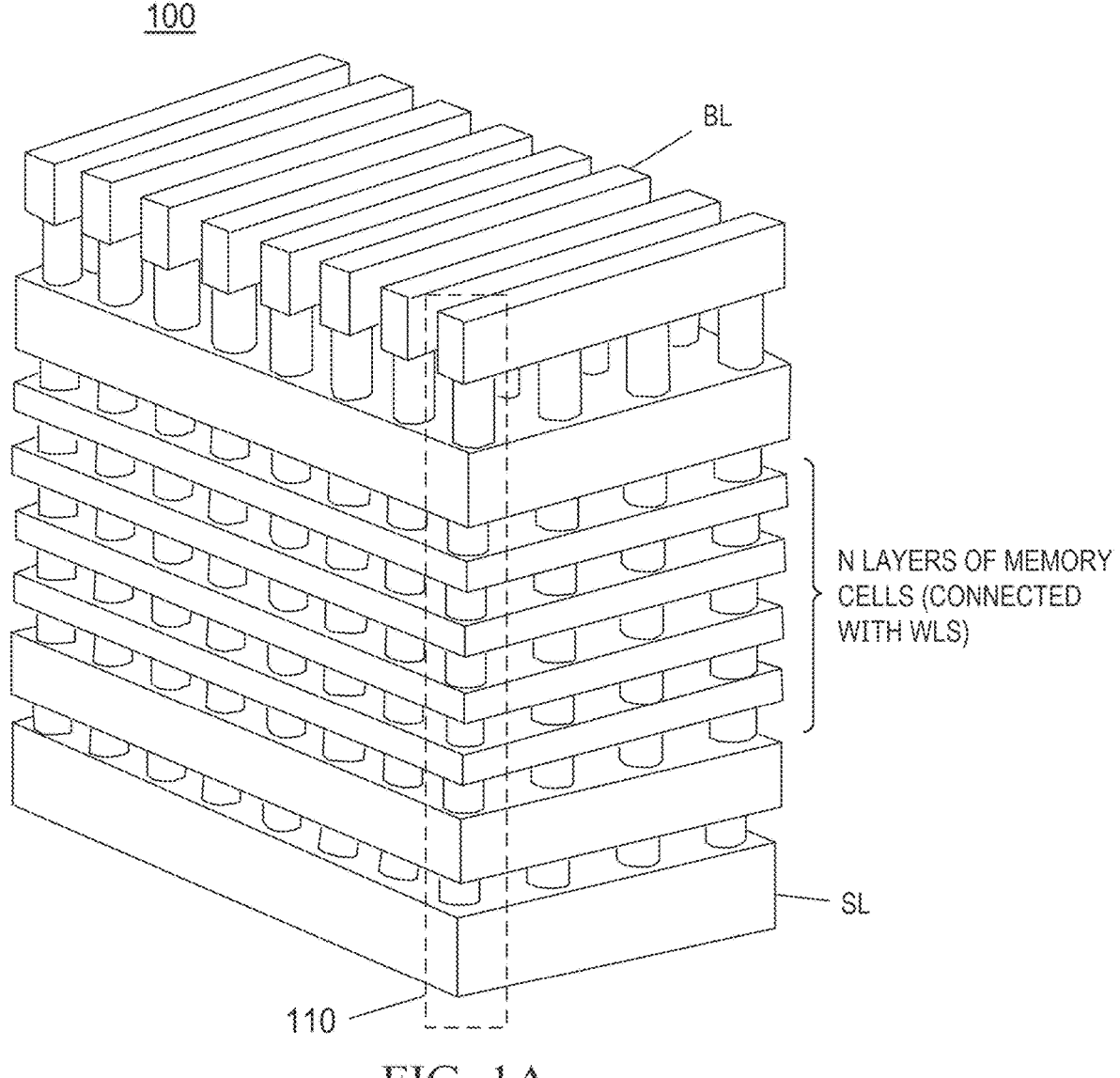
FIGS. 1A and 1B (collectively referred to herein as FIG. 1) are a schematic structural diagram of a 3D memory provided by an example of the present application.
Figure 1B:
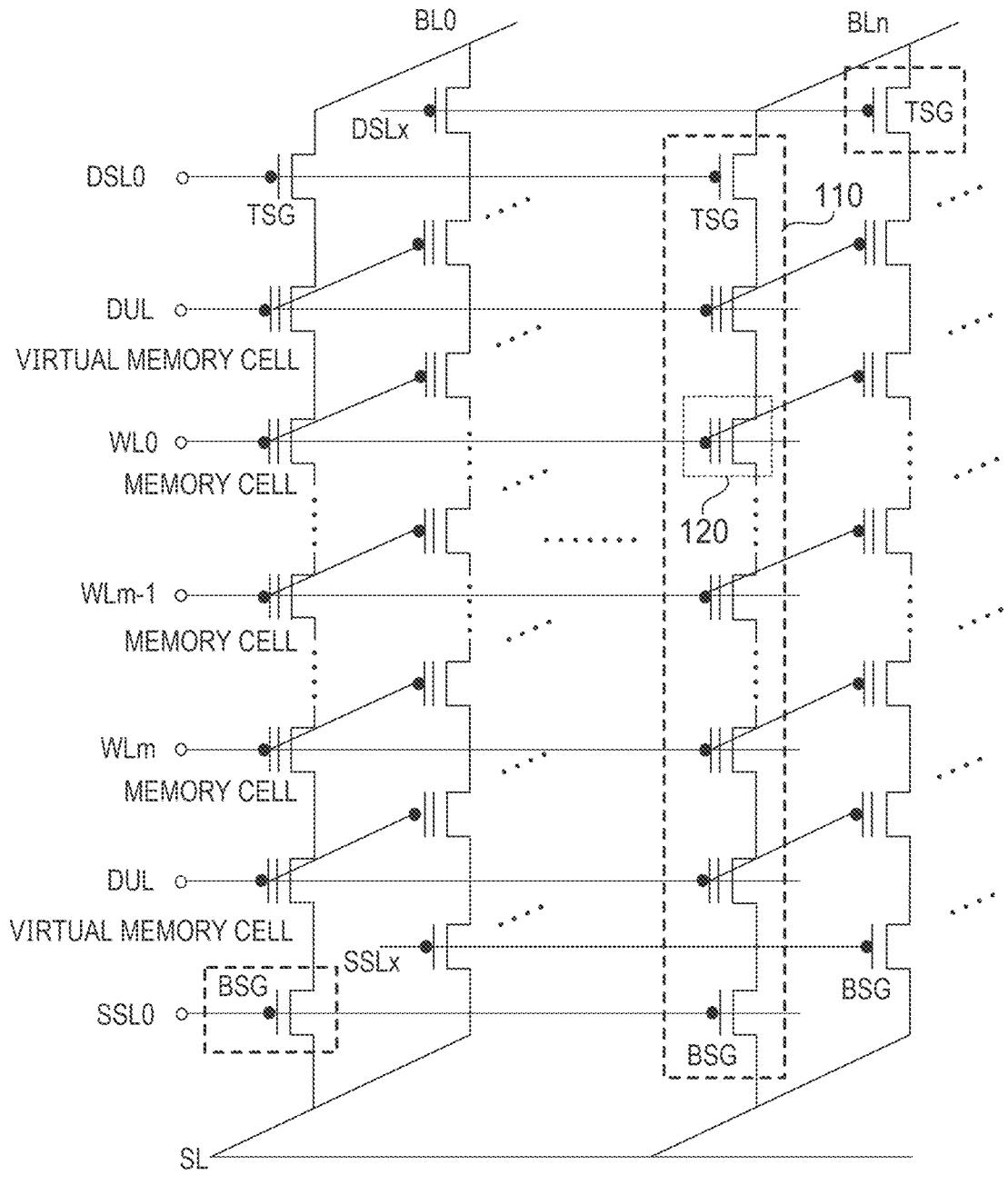

The 3-Dimension (3D) memory is a multi-layer stacked memory. In an example, the 3D memory is a 3D NAND flash. As shown in FIG. 1, a plurality of memory strings 110 comprised by the 3D memory 100 are arranged along a direction parallel to a bearing surface of a substrate, and a plurality of memory cells 120 in each memory string 110 are distributed along a direction perpendicular to the bearing surface of the substrate. That is, the plurality of memory cells comprised in the 3D memory are arranged in a three-dimensional array on the substrate, and form a memory array.

The memory strings 110 are connected with a Bit Line (BL) at one end, and connected with a Source Line (SL) at the other end.

The memory cells in each memory string are further connected with the memory cells in other memory strings through Word Lines (WLs). For example, each memory string may comprise 64 memory cells, then the 3D memory may comprise 64 word lines WL<63:0>, and each word line is connected with part of the memory cells on the same layer (e.g., having the same height relative to the substrate). It is to be noted that the 64 memory cells only represent an example, the present application is not limited thereto, and in some examples, each memory string may comprise more than 64, such as 128, 196, etc., memory cells. In the 3D memory, various memory cells connected with the same word line are referred to as a page, and all the memory strings sharing a set of word lines are referred to as a block.

The memory strings 110 further comprise top select transistors connected with drains of first ones among the memory cells, and bottom select transistors connected with sources of last ones among the memory cells. The top select transistors are also referred to as Top Select Gates (TSGs) or drain select transistors. The bottom select transistors are also referred to as Bottom Select Gates (BSGs) or source select transistors.

Gates of the TSGs are connected with Drain Select Lines (DSLs), sources of the TSGs are connected with the drains of the first ones among the memory cells, and drains of the TSGs are connected with the bit lines.

Gates of the BSGs are connected with Source Select Lines (SSLs), drains of the BSGs are connected with sources of the last ones among the memory cells, and sources of the BSGs are connected with the source lines.

As can be seen from FIG. 1, the memory cells in the memory string 110 and the memory cells in other memory strings share a set of WLs. Supposing that each memory string comprises m+1 memory cells, the 3D memory may comprise m+1 WLs: WL0 to WLm, wherein m is an integer greater than 1. Each WL is connected with various memory cells on the same layer (e.g., having the same height relative to the bearing surface of the substrate). Alternatively, it may be understood that control gates of various memory cells on the same layer, and gate connection lines between various control gates constitute one WL.

According to the volume of data that can be stored by the memory cells, the types of the memory cells can be classified into a Single-Level Cell (SLC), a Multi-Level Cell (MLC), a Trinary-Level Cell (TLC), a Quad-Level Cell (QLC), etc. Each SLC can store 1 bit of data, each MLC can store 2 bits of data, each TLC can store 3 bits of data, and each QLC can store 4 bits of data. In the 3D memory, the data stored in various memory cells on the same layer may constitute k pages, wherein k is the number of bits of data capable of being stored by each memory cell.

In the examples of the present application, the memory cells in the 3D memory may be field effect transistors capable of storing data, such as floating gate field effect transistors or charge trap field effect transistors, etc. The TSGs and the BSGs may be either ordinary field effect transistors, or field effect transistors capable of storing data. The floating gate field effect transistor comprises a source, a drain, and two gates. The two gates both are conductors, and one of the two gates is a Control Gate (CG), and another gate is a floating gate, or FG for short. The control gate is configured to connect the word lines, and the floating gate is configured to store data. The charge trap field effect transistors comprise sources, drains, control gates, and charge trap layers, wherein the charge trap layers are cells configured to store data, and are made of an insulating material, such as silicon nitride. A data writing principle of the memory cells is introduced below by taking the floating gate field effect transistors as an example.

When data is written to the memory cells, a program voltage may be loaded to control gates of the floating gate field effect transistors to cause electrons in channels of the floating gate field effect transistors to tunnel to the floating gates. The number of electrons tunneling to the floating gates can be controlled by controlling a magnitude of the program voltage, so as to further control a magnitude of a threshold voltage Vth of the floating gate field effect transistor. Generally, the higher the quantity of charge stored in the floating gates is, the higher the threshold voltage Vth of the floating gate field effect transistor is. It may be understood that, when the threshold voltages Vth of the floating gate field effect transistors are different, the voltages required to be loaded to the control gates of the floating gate field effect transistors when controlling to turn on the floating gate field effect transistors are different. Therefore, the magnitude of the threshold voltage Vth of the floating gate field effect transistor may reflect content of data stored by the floating gate field effect transistor.

It is to be understood that, in the 3D memory, channels of various memory cells in each memory string may be connected sequentially, and form a pillar-shaped structure perpendicular to the substrate.

When the memory is programmed, for example, the MLC may be configured to store two digits of data per memory cell represented by four Vth ranges (programmed states), the TLC may be configured to store three digits of data per memory cell represented by eight Vth ranges (programmed states), the QLC may be configured to store four digits of data per memory cell represented by sixteen Vth ranges (programmed states), and so on.

For example, when the 3D NAND flash is an MLC flash, the memory cells of the 3D NAND flash are programmed to four states corresponding to bit codes 11, 10, 01, and 00, e.g., an erased state E0, and programmed states P1, P2, and P3. In another example, when the 3D NAND flash is a TLC 3D NAND flash, the memory cells of the 3D NAND flash are programmed into an erased state and seven programmed states corresponding to bit codes 111, 110, 010, 011, 001, 000, 100, and 101.

As the demand for storage capacity rises, current mainstream memory devices employ the 3D NAND flashes. In order to quest for higher storage densities, the number of stacking layers and the number of storage bits in a single memory cell are getting higher and higher. In an example, the single memory cell currently stores four bits, and is referred to as the QLC. In order to realize four-bit storage, one page needs to be divided into 16 programmed states, and in order to compress a threshold voltage distribution width of each programmed state on the page to increase a read window, a write operation generally needs to be performed on the page for a plurality of times. In the examples of the present application, two write operations, which respectively are a first program operation and a second program operation, are taken as an example for description, wherein the first program operation may be further referred to as coarse programming, and the second program operation may be further referred to as fine programming. Coarse programming and fine programming are two stages for programming the memory. The goal of the two stages is to ensure that data is accurately written to the memory cell, and damage to the memory cell is avoided at the same time, thereby guaranteeing the reliability and service life of the memory.

The coarse programming stage is intended to quickly write most of the data to a memory cell without pursuing extremely-high accuracy. The threshold voltage (Vth) of the memory cell (e.g., a floating gate transistor in a flash) quickly changes by employing a relatively-high voltage and a relatively-long pulse width. Due to the employing of a "rough" method, a predetermined value lower than a target threshold voltage is generally set as a stop point to avoid over-programming.

The fine programming stage is performed after coarse programming, and is intended to calibrate the memory cell after the coarse programming stage to guarantee the accuracy of data and the performance of the memory. By employing a relatively-low voltage and a relatively-short pulse width, the threshold voltage of the memory cell is adjusted more finely, so as to cause the threshold voltage to reach or close to the target threshold voltage. Fine programming requires more time and finer control, but may improve the reliability of the memory and reduce data errors.

In the flash and some other non-volatile memory technologies, the two-step programming processes are closely linked; and coarse programming provides a foundation for fine programming, and fine programming guarantees accurate data storage. The trade-off between a program speed and data accuracy may be balanced by using the two-step programming processes, and the service life of the memory may prolonged at the same time.

Figure 2:
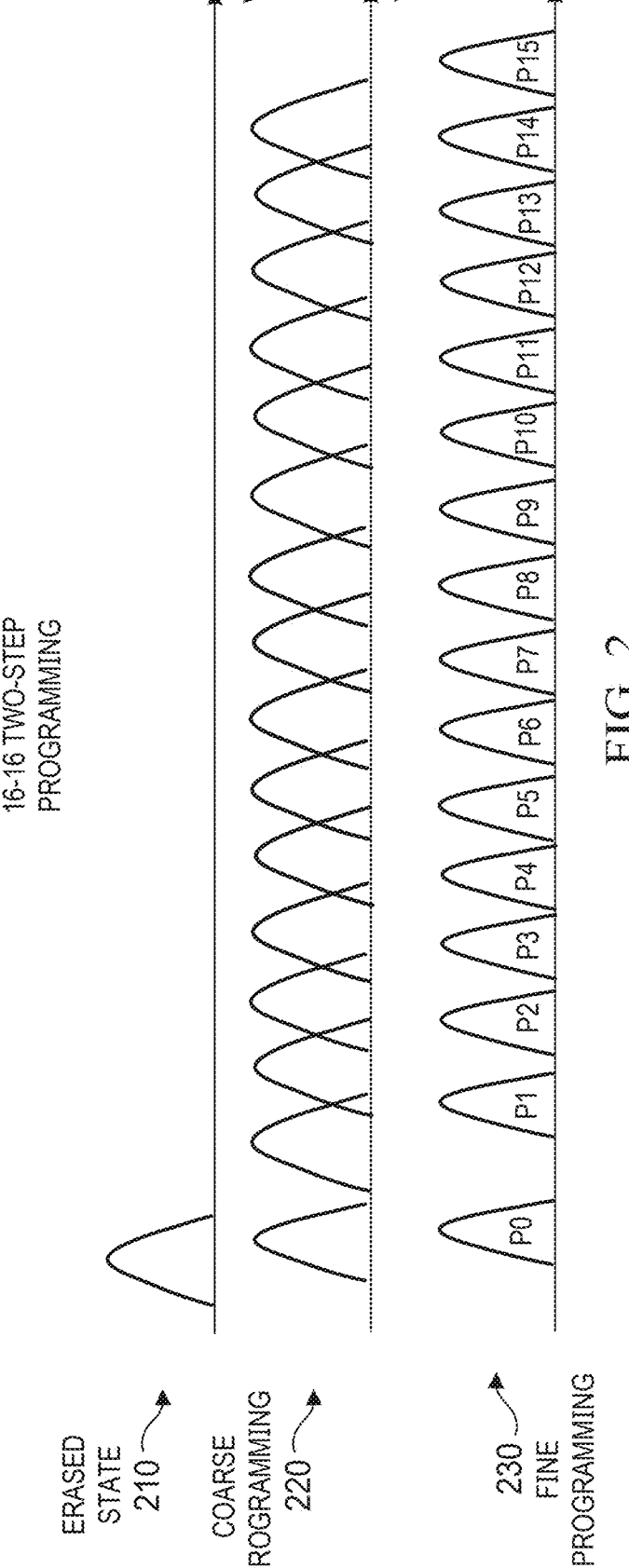
FIG. 2 is a schematic diagram of a program mode provided by an example of the present application.

The page may be first programmed to 16 programmed states in a write process, and then finely programmed to final 16 states from the 16 states. In an example, as shown in FIG. 2, in a 16-16 two-step programming process, an erased state 410 exists correspondingly first, and then coarse programming 220 is performed on the page to obtain 16 states with wide threshold voltage distribution widths, comprising an erased state and programmed states, and fine programming 230 is performed on the page on the basis of coarse programming, so as to compress the threshold voltage distribution width of each programmed state.

However, in order to save program time, 16 states may be not programmed out during coarse programming, and n states (n<16) are programmed out. For example, 8 states may be coarsely programmed out first, and then 16 states are finely programmed out from the 8 states.

Figure 3:
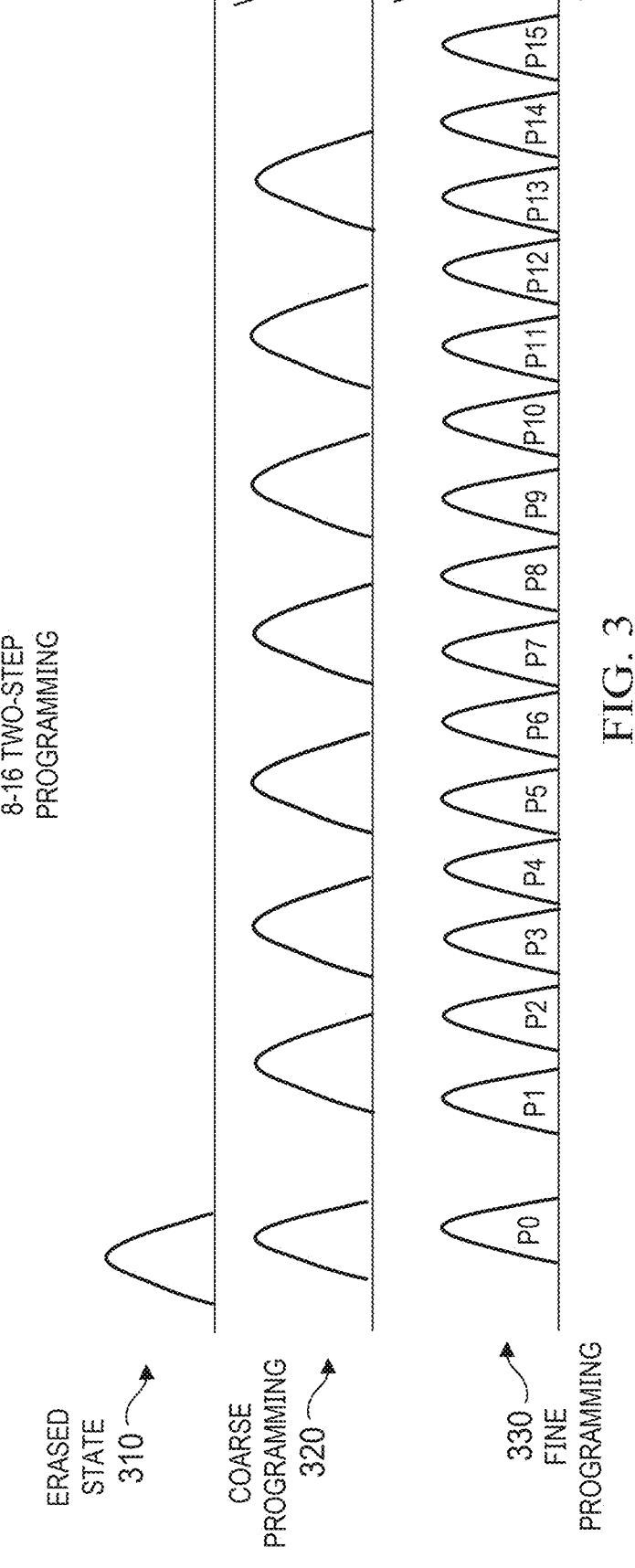
FIG. 3 is a schematic diagram of another program mode provided by an example of the present application.

In an example, as shown in FIG. 3, in an 8-16 two-step programming process, an erased state 310 exists correspondingly first, and then coarse programming 320 is performed on the page to obtain 8 states of which programmed states have wide threshold voltage distribution widths, and fine programming 330 is performed on the page on the basis of coarse programming, so as to compress the threshold voltage distribution width of each programmed state on the page, and to obtain 16 states on the page.

Alternatively, 4 states are coarsely programmed out first, and then 16 states are finely programmed out from the 4 states.

Figure 4:
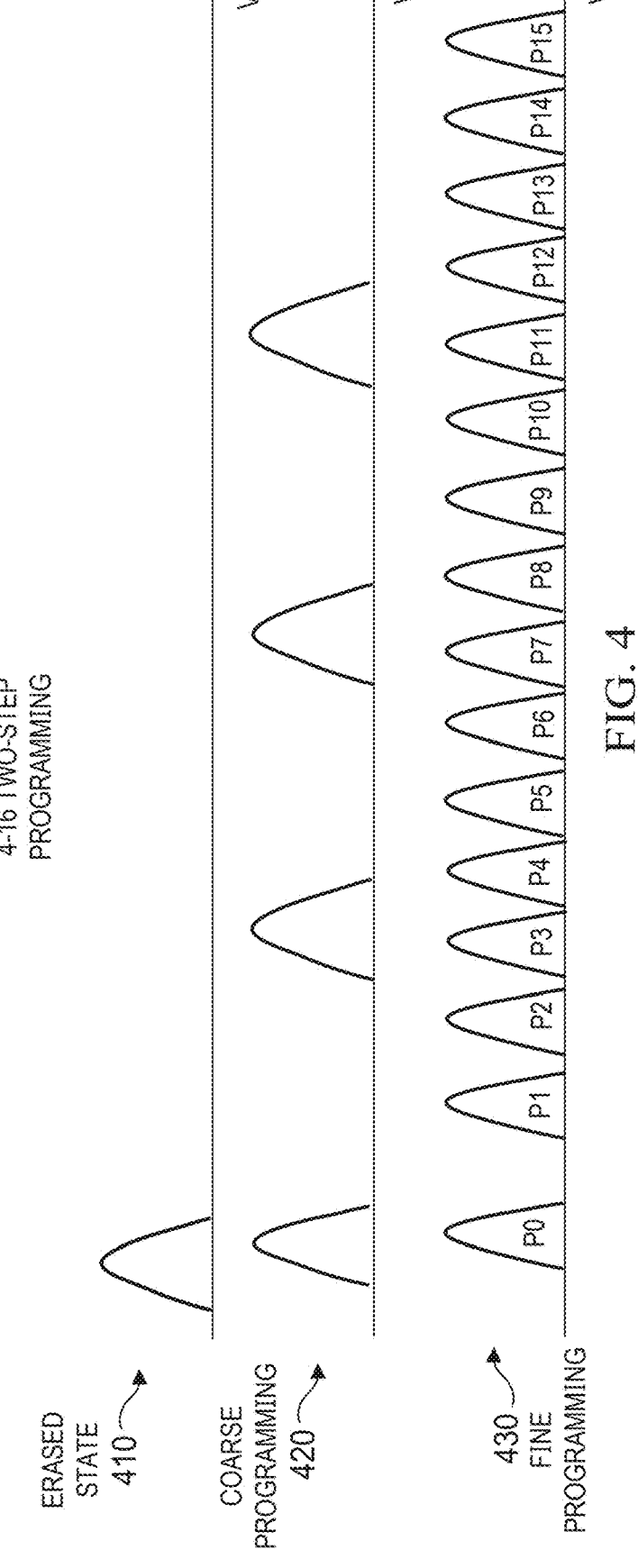
FIG. 4 is a schematic diagram of another program mode provided by an example of the present application.

In an example, as shown in FIG. 4, in a 4-16 two-step programming process, an erased state 410 exists correspondingly first, and then coarse programming 420 is performed on the page to obtain 4 states of which programmed states have wide threshold voltage distribution widths, and fine programming 430 is performed on the page on the basis of coarse programming, so as to compress the threshold voltage distribution width of each programmed state on the page, and to obtain 16 states on the page.

It is to be noted that, the above-mentioned two-step programming solutions are illustrative examples only, two-step programming may also be implemented as other solutions such as 8-32 two-step programming, 16-32 two-step programming, etc., and this example is not limited thereto.

Figures 5, 6:
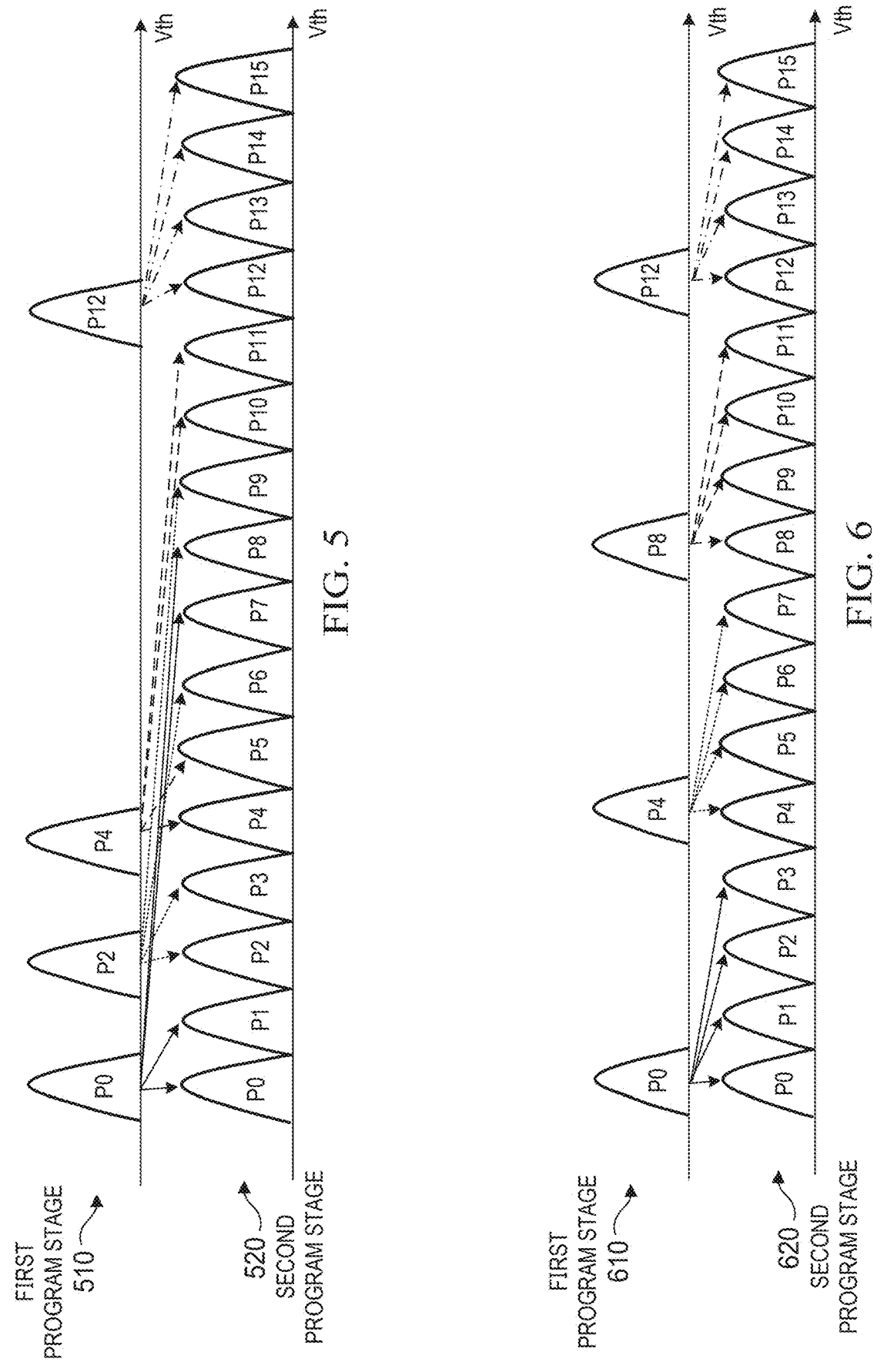

In the examples of the present application, a 4-16 two-step programming process is taken as an example for description. That is, 4 states (comprising 1 erased state and 3 programmed states) are first programmed out in a first program stage, and on the basis of the 4 states programmed in the first program stage, 16 states (comprising 1 erased state and 15 programmed states) are programmed out in a second program stage. In the examples of the present application, the following program modes are provided for illustration:

Mode I: FIG. 5 is a schematic diagram of a program mode provided by an example of the present application. As shown in FIG. 5, in a first program stage 510, the memory cells are programmed to four states, comprising an erased state P0, a programmed state P2, a programmed state P4, and a programmed state P12.

In a second program stage 520, on the basis of programmed results in the first program stage 510, the erased state P0 is programmed to an erased state P0, a programmed state P1, a programmed state P7, and a programmed state P8; the programmed state P2 is programmed to a programmed state P2, a programmed state P3, a programmed state P6, and a programmed state P9; the programmed state P4 is programmed to a programmed state P4, a programmed state P5, a programmed state P10, and a programmed state P11; and the programmed state P12 is programmed to a programmed state P12, a programmed state P13, a programmed state P14, and a programmed state P15.

In an example, in the above-mentioned 4-16 two-step programming mode, changes in Grey codes are shown in Table I:

performing programming for one time, temporarily store program data to be written to the four logical pages.

The Grey code is also referred to as a reflected binary code, which is a binary number system, and in an encoding system of the Grey code, successive values change by only one digit.

In the Grey code, each time a number is added, a value of one bit is changed only, which means that only one bit is changed during a conversion process from any number to a neighbor number. This feature is especially important for reducing errors in a digital system. As shown in the above Table I, only the program data in the DC latch is changed from the erased state P0 to the programmed state P1, only the program data in the D2 latch is changed from the programmed state P1 to the programmed state P2, and so on. RD #3 indicates that the program data in the D1 latch changes 3 times in total in the programming process, e.g., from the programmed state P3 (program data 1) to the programmed state P4 (program data 0), from the programmed state P5 (program data 0) to the programmed state P6 (program data 1), and from the programmed state P9 (program data 1) to the programmed state P10 (program data 0). Likewise, taking the D2 latch as an example, RD #4 indicates that the program data in the D2 latch changes 4 times in total in the programming process.

In the above Table I, RD #s corresponding to the four latches respectively are 3, 4, 4, and 4, that is, an encoding mode corresponding to the above Table I is a 4-3-4-4 encoding mode. The encoding mode balances the Gray code such that read latency of each logical page is more balanced.

In addition to the 4-3-4-4 encoding mode, examples of the present application further provide a 1-2-6-6 encoding mode.

Mode II: FIG. 6 is a schematic diagram of a program mode provided by another example of the present application. As shown in FIG. 6, in a first program stage 610, the memory cells are programmed to four states, comprising an erased state P0, a programmed state P4, a programmed state P8, and a programmed state P12.

In a second program stage 620, on the basis of programmed results in the first program stage 610, the erased

TABLE I

| Grey code | P0 | P1 | P2 | P3 | P4 | P5 | P6 | P7 | P8 | P9 | P10 | P11 | P12 | P13 | P14 | P15 | RD# |
|---|---|---|---|---|---|---|---|---|---|---|---|---|---|---|---|---|---|
| D1 (LP) | 1 | 1 | 1 | 1 | 0 | 0 | 1 | 1 | 1 | 1 | 0 | 0 | 0 | 0 | 0 | 0 | 3 |
| D2 (MP) | 1 | 1 | 0 | 0 | 0 | 0 | 0 | 1 | 1 | 0 | 0 | 0 | 1 | 1 | 1 | 1 | 4 |
| D3 (UP) | 1 | 1 | 1 | 1 | 1 | 0 | 0 | 0 | 0 | 0 | 0 | 1 | 1 | 0 | 0 | 1 | 4 |
| DC (XP) | 1 | 0 | 0 | 1 | 1 | 1 | 1 | 1 | 0 | 0 | 0 | 0 | 0 | 0 | 1 | 1 | 4 |

D1, D2, D3, and DC represent latches, corresponding respectively to four logical pages programmed, which respectively are a lower page LP, a middle page MP, an upper page UP, and an extra page XP; and a peripheral circuit is configured to respectively perform the first program stage and the second program stage on the memory cell array on a physical page in a highly cached programming manner, wherein during the first program stage and the second program stage, rows selected by the memory cells are programmed based on the above-mentioned four logical pages. D1, D2, and D3 are data latches, DC is a cache latch, and the four latches are configured to, in a process of state P0 is programmed to an erased state P0, a programmed state P1, a programmed state P2, and a programmed state P3; the programmed state P4 is programmed to a programmed state P4, a programmed state P5, a programmed state P6, and a programmed state P7; the programmed state P8 is programmed to a programmed state P8, a programmed state P9, a programmed state P10, and a programmed state P11; and the programmed state P12 is programmed to a programmed state P12, a programmed state P13, a programmed state P14, and a programmed state P15.

Mode III: FIG. 7 is a schematic diagram of a program mode provided by another example of the present application. The mode corresponds to the 4-3-4-4 encoding mode. As shown in FIG. 7, in a first program stage 710, the memory cells are programmed to four states, comprising an erased state P0, a programmed state P3, a programmed state P6, and a programmed state P10.

In a second program stage 720, on the basis of programmed results in the first program stage 710, the erased state P0 is programmed to an erased state P0, a programmed state P1, a programmed state P2, and a programmed state P9; the programmed state P3 is programmed to a programmed state P3, a programmed state P4, a programmed state P5, and a programmed state P8; the programmed state P6 is programmed to a programmed state P6, a programmed state P7, a programmed state P12, and a programmed state P13; and the programmed state P10 is programmed to a programmed state P10, a programmed state P11, a programmed state P14, and a programmed state P15.

Mode IV: FIG. 8 is a schematic diagram of a program mode provided by another example of the present application. The mode corresponds to the 4-3-4-4 encoding mode. As shown in FIG. 8, in a first program stage 810, the memory cells are programmed to four states, comprising an erased state P0, a programmed state P3, a programmed state P5, and a programmed state P7.

In a second program stage 820, on the basis of programmed results in the first program stage 810, the erased state P0 is programmed to an erased state P0, a programmed state P1, a programmed state P2, and a programmed state P15; the programmed state P3 is programmed to a programmed state P3, a programmed state P4, a programmed state P10, and a programmed state P11; the programmed state P5 is programmed to a programmed state P5, a programmed state P6, a programmed state P9, and a programmed state P12; and the programmed state P7 is programmed to a programmed state P7, a programmed state P8, a programmed state P13, and a programmed state P14.

Figures 9, 10:
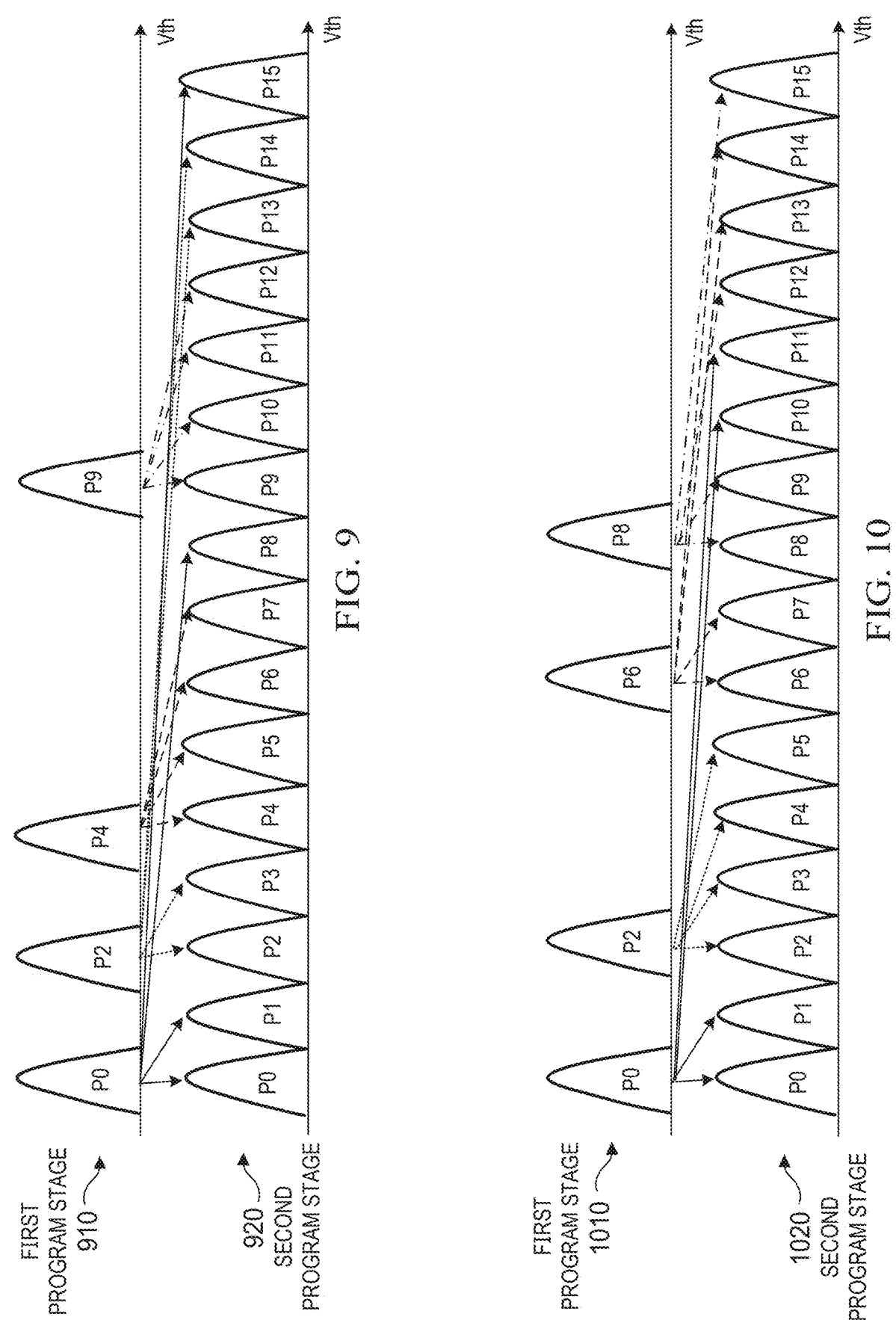

Mode V: FIG. 9 is a schematic diagram of a program mode provided by another example of the present application. The mode corresponds to the 4-3-4-4 encoding mode. As shown in FIG. 9, in a first program stage 910, the memory cells are programmed to four states, comprising an erased state P0, a programmed state P2, a programmed state P4, and a programmed state P9.

In a second program stage 920, on the basis of programmed results in the first program stage 910, the erased state P0 is programmed to an erased state P0, a programmed state P1, a programmed state P8, and a programmed state P15; the programmed state P2 is programmed to a programmed state P2, a programmed state P3, a programmed state P7, and a programmed state P14; the programmed state P4 is programmed to a programmed state P4, a programmed state P5, a programmed state P6, and a programmed state P13; and the programmed state P9 is programmed to a programmed state P9, a programmed state P10, a programmed state P11, and a programmed state P12.

Mode VI: FIG. 10 is a schematic diagram of a program mode provided by another example of the present application. The mode corresponds to the 4-3-4-4 encoding mode. As shown in FIG. 10, in a first program stage 1010, the memory cells are programmed to four states, comprising an erased state P0, a programmed state P2, a programmed state P6, and a programmed state P8.

In a second program stage 1020, on the basis of programmed results in the first program stage 1010, the erased state P0 is programmed to an erased state P0, a programmed state P1, a programmed state P10, and a programmed state P11; the programmed state P2 is programmed to a programmed state P2, a programmed state P3, a programmed state P4, and a programmed state P5; the programmed state P6 is programmed to a programmed state P6, a programmed state P7, a programmed state P13, and a programmed state P14; and the programmed state P8 is programmed to a programmed state P8, a programmed state P9, a programmed state P12, and a programmed state P15.

In the above-mentioned program mode, in regardless of the 4-3-4-4 program mode or the 1-2-6-6 program mode, interlayer interference of WLn+1 to WLn exists, resulting in poor reliability of the programmed results. The above-mentioned example is discussed with the 4-16 two-step programming mode, however it is to be noted that the interlayer interference of WLn+1 to WLn also exists in other n-16 two-step programming processes, leading to the problem of low reliability of the programmed results.

The interlayer interference ("WL to WL interference" or "coupling") is an important limiting factor that restricts the improvement of the reliability of a flash memory. The interlayer interference is mainly manifested as interference of WLn+1 programming to WLn, resulting in an increase in a WLn threshold voltage and distribution widening, and thus resulting in an increase in bit error rate and deterioration in reliability. Furthermore, as the number of stacking layers increases, due to the limitation of a channel etching process, a distance between layers is required to be reduced, resulting in worse interlayer interference. Therefore, studying how to reduce the interlayer interference is important for the improvement of the reliability of the flash memory.

Figure 11:
FIG. 11 is a schematic sequence diagram of a program stage provided by an example of the present application.

FIG. 11 shows a first-to-second program stage sequence 1100 provided by an example of the present application. In the program stage sequence shown in FIG. 11, first, ① a first program stage of WLn is performed; next, ② a first program stage of WLn+1 is performed; and after the first program stage of WLn+1 is performed, ③ a second program stage of WLn is performed. At this point, the program stages of WLn are completed, and next, ④ a first program stage of WLn+2 is performed; and ⑤ a second program stage of WLn+1 is performed.

However, since the second program stage of WLn has been completed when the second program stage of WLn+1 is performed, and an interlayer spacing between WLn+1 and WLn is relatively small, the second program stage of WLn+1 produces the interlayer interference to WLn, resulting in poor reliability of a programmed result of WLn.

Figure 12:
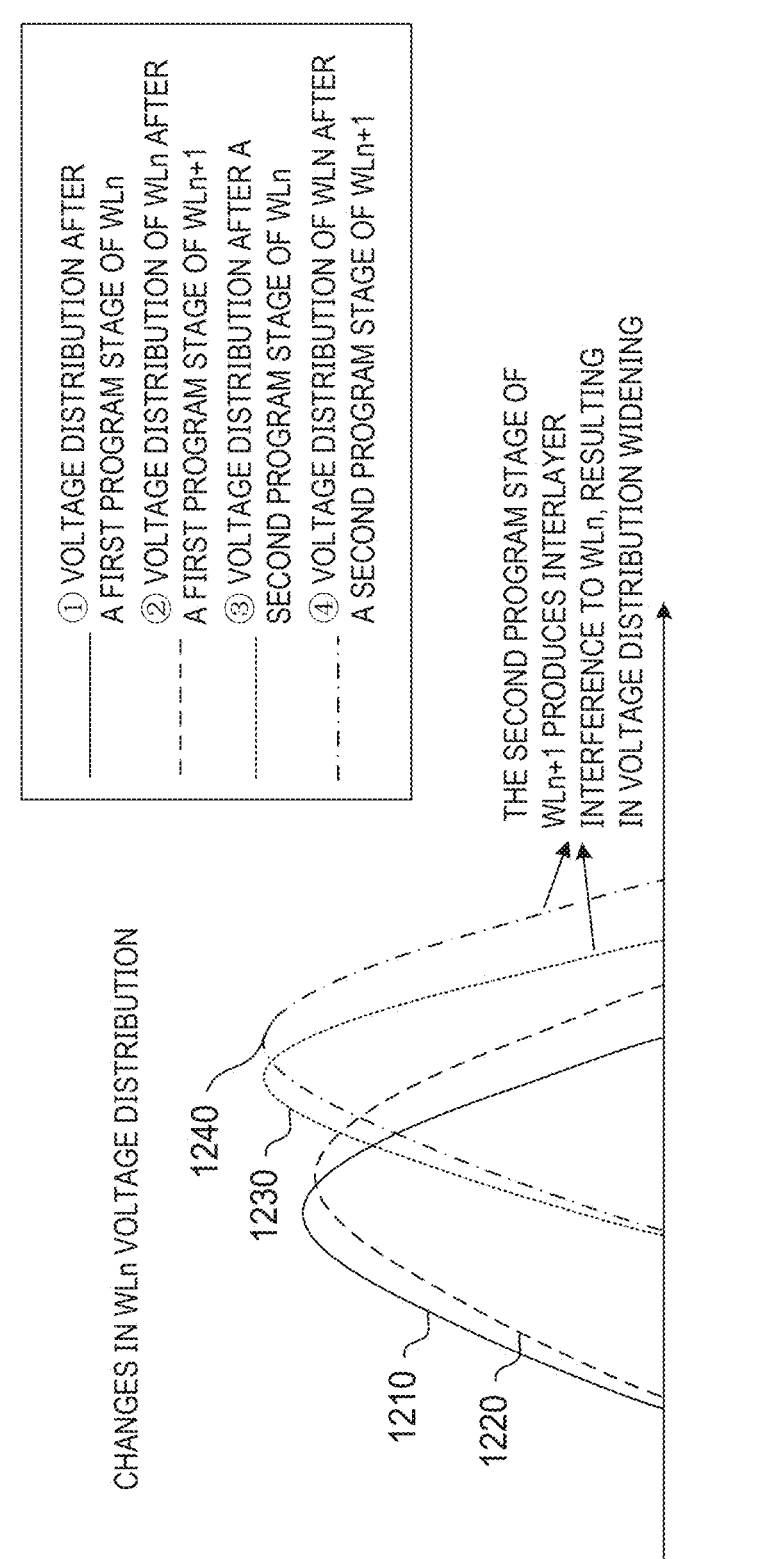
FIG. 12 is a schematic diagram of changes in voltage distribution widening provided by an example of the present application.

In an example, as shown in FIG. 12, voltage distribution after WLn passes through the first program stage is shown in a voltage curve 1210, and after WLn+1 passes through the first program stage, the voltage distribution of WLn is shown in a voltage curve 1220, such that it is apparent that distribution widening exists relative to the voltage curve 1210.

Similarly, voltage distribution after WLn passes through the second program stage is shown in a voltage curve 1230, and after WLn+1 passes through the second program stage, the voltage distribution of WLn is shown in a voltage curve 1240, such that it is apparent that distribution widening exists in the voltage curve 1240 relative to the voltage curve 1230, e.g., the voltage distribution of WLn is widened due to the interlayer interference of the second program stage of WLn+1 to WLn.

Figure 13:
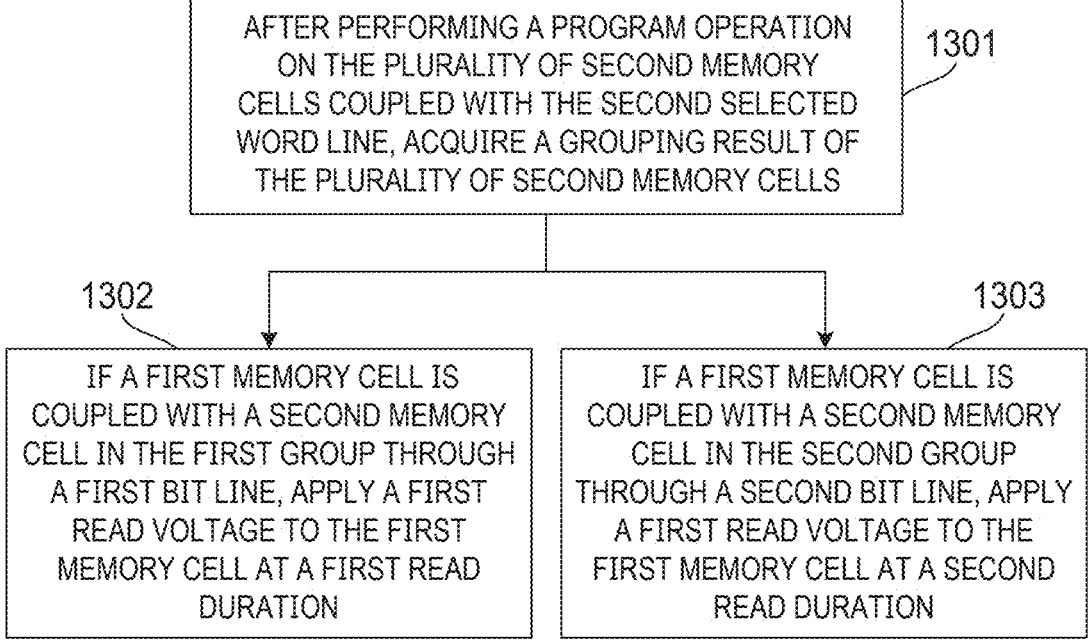
FIG. 13 is a flow diagram of an operation method of a memory provided by an example of the present application.

In view of the above-mentioned problems, examples of the present application provide an operation method of a memory, as shown in FIG. 13, FIG. 13 is a flow diagram of an operation method of a memory provided by an example of the present application. The memory comprises a memory array and a peripheral circuit, wherein the memory array comprises memory cells; the memory cells comprise a plurality of first memory cells coupled with a first selected word line, and a plurality of second memory cells coupled with a second selected word line, wherein the first selected word line and the second selected word line are adjacent to each other in terms of word line distribution structure. The operation method of a memory comprises the following operations. In an example, the following operations are performed and implemented by the peripheral circuit in the memory.

Operation 1301, after performing a program operation on the plurality of second memory cells coupled with the second selected word line, acquiring a grouping result of the plurality of second memory cells.

The grouping result comprises a first group and a second group, the program operation comprises a first program stage and a second program stage, and voltage differences of the second memory cells in the first group in the first program stage and the second program stage are less than voltage differences of the second memory cells in the second group in the first program stage and the second program stage. In some examples, the interlayer interference has the following characteristics: if a program threshold voltage of a memory cell of WLn+1 after the first program stage is Vt1, and a program threshold voltage after the second program stage is Vt2, and if a numerical value of Vt2−Vt1 is larger, the interlayer interference of the memory cell coupled with WLn+1 to a memory cell coupled with WLn is greater.

Thus, in the examples of the present application, the memory cells with larger Vt2−Vt1 are divided into a same group, and the memory cells with smaller Vt2−Vt1 are divided into a same group.

In an example, the program process shown in FIG. 5 is taken as an example for description, as shown in FIG. 5, the erased state P0 obtained through programming in the first program stage corresponds to an erased state P0, a programmed state P1, a programmed state P7, and a programmed state P8 in the second program stage; the programmed state P2 obtained through programming in the first program stage corresponds to a programmed state P2, a programmed state P3, a programmed state P6, and a programmed state P9 in the second program stage; the programmed state P4 obtained through programming in the first program stage corresponds to a programmed state P4, a programmed state P5, a programmed state P10, and a programmed state P11 in the second program stage; and the programmed state P12 obtained through programming in the first program stage corresponds to a programmed state P12, a programmed state P13, a programmed state P14, and a programmed state P15 in the second program stage. According to changing amplitudes of the programmed states between the first program stage and the second program stage, the memory cells of WLn+1 are defined as two groups, as shown in Table II below:

TABLE II

| Group | States of WLn + 1 after second program stage | Degree of interlayer interference of WLn + 1 to WLn |
|---|---|---|
| First group | P0, P1, P2, P3, P4, P5, P12, P13 | Small |
| Second group | P6, P7, P8, P9, P10, P11, P14, P15 | Large |

When the states corresponding to WLn+1 after the second program stage are in the first group in Table II above, it indicates that the interlayer interference of WLn+1 to WLn is small; and when the states corresponding to WLn+1 after the second program stage are in the second group in Table II above, it indicates that the interlayer interference of WLn+1 to WLn is large.

Figure 14:
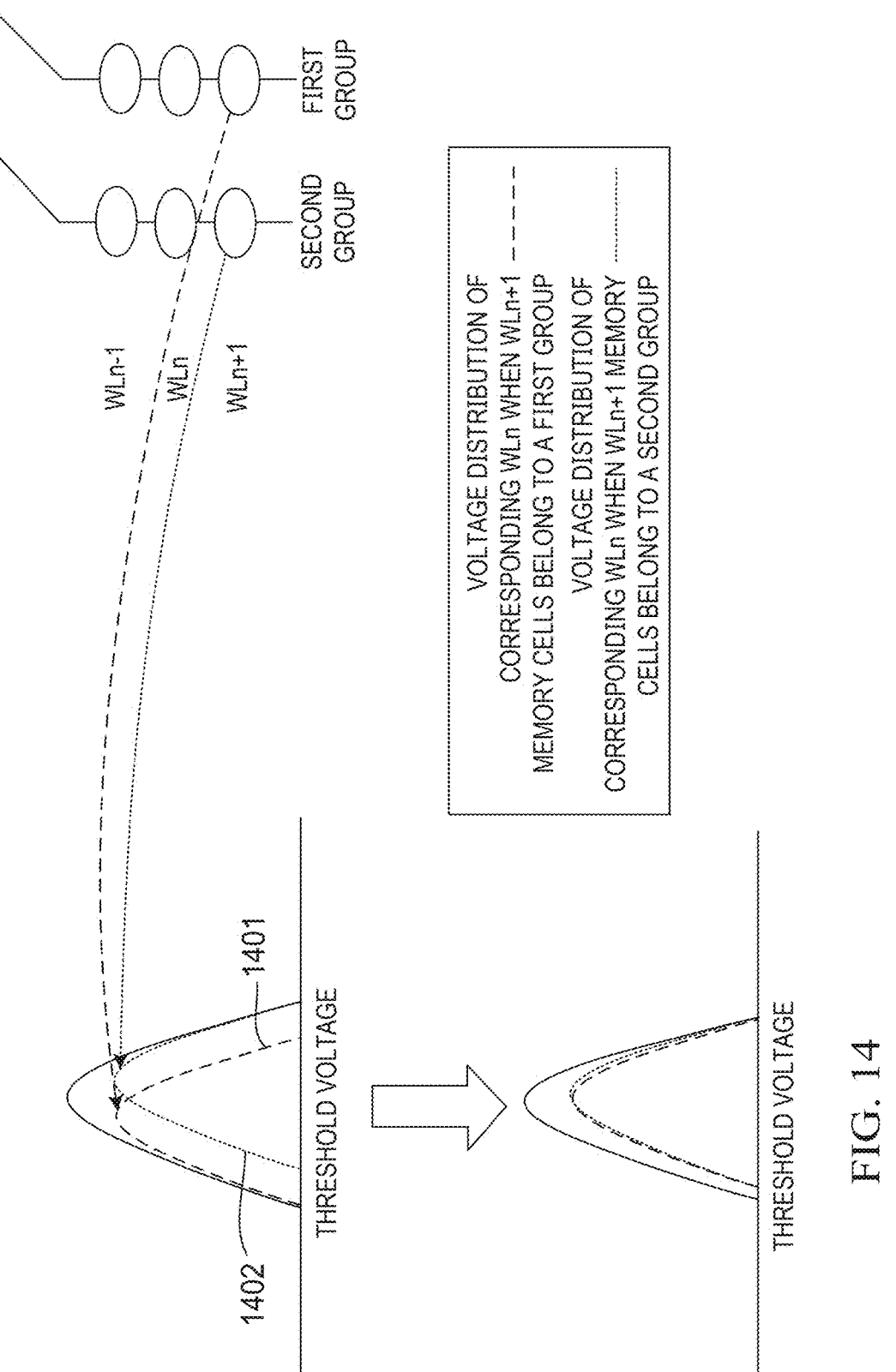
FIG. 14 is a schematic diagram of changes in distribution of threshold voltages provided based on the example shown in FIG. 13.

In an example, as shown in FIG. 14, a curve 1401 corresponds to threshold voltage distribution of the memory cells of WLn when WLn+1 belongs to the first group; and a curve 1402 corresponds to threshold voltage distribution of the memory cells of WLn when WLn+1 belongs to the second group.

At least one of the following solutions is comprised when the plurality of second memory cells are grouped according to a grouping rule:

First, in some examples, when the plurality of second memory cells coupled with a second word line are grouped, a grouping rule of the plurality of second memory cells is determined based on a program mode of the plurality of second memory cells, wherein the grouping rule comprises groups corresponding to the erased state and the programmed state, and the plurality of second memory cells are grouped based on the grouping rule and the erased state or programmed states corresponding respectively to the plurality of second memory cells after the program operation, so as to obtain the grouping result.

After the program operation is performed on the plurality of second memory cells coupled with the second selected word line, the erased state or programmed states corresponding respectively to the plurality of second memory cells are read; and the plurality of second memory cells are grouped based on the erased state or programmed states corresponding respectively to the plurality of second memory cells and based on the groups corresponding to the erased state and programmed states in the grouping rule, so as to obtain the grouping result. In an example, it is determined that the plurality of second memory cells are programmed according to the above-mentioned program mode shown in FIG. 5, then in the grouping rule of the plurality of second memory cells, the second memory cells programmed to P0, P1, P2, P3, P4, P5, P12, and P13 in the second program stage are divided into the first group, and the second memory cells programmed to P6, P7, P8, P9, P10, P11, P14, and P15 in the second program stage are divided into the second group. Then if the second memory cells coupled with the second word line are programmed to the programmed state P2 in the second program stage, the second memory cells are divided into the first group.

Second, after the program operation is performed on the plurality of second memory cells coupled with the second selected word line, the voltage differences of the plurality of second memory cells in the first program stage and the second program stage are read; and the plurality of second memory cells are grouped based on the voltage differences corresponding respectively to the plurality of second memory cells, so as to obtain the grouping result.

In an example, when a voltage difference of a second memory cell in the first program stage and the second program stage is less than a voltage difference threshold, it is determined that the second memory cell belongs to the first group; or when the voltage difference of a second memory cell in the first program stage and the second program stage reaches the voltage difference threshold, it is determined that the second memory cell belonges to the second group. The voltage difference threshold is a preset numerical value.

In an example, a preset voltage difference threshold is 1v, and if a threshold voltage reached by the second memory cell after the first program stage is 0.3v, and a threshold voltage reached after the second program stage is 1.5v, the second memory cell is divided into the second group; and if the threshold voltage reached by the second memory cell after the first program stage is 0.3v, and the threshold voltage reached after the second program stage is 0.5v, the second memory cell is divided into the first group.

It is to be noted that, in this example, the first group and the second group are taken as an example for description. In some examples, the plurality of second memory cells may also be divided into more groups, for example, divided according to the program mode, or the plurality of voltage difference thresholds are set to group the plurality of second memory cells.

Operation 1302, if a first memory cell is coupled with a second memory cell in the first group through a first bit line, applying a first read voltage to the first memory cell at a first read duration.

In some examples, if the first memory cells coupled with a first selected word line are coupled with the second memory cells in the first group through the first bit line, it indicates that the first memory cells in the program stage are less subjected to the interlayer interference from the second memory cells, such that when the first memory cells are read, the first read voltage is applied to the first memory cells at a preset first read duration.

The second memory cells in the first group are memory cells having relatively little interlayer interference to the first memory cells, that is, the voltage differences of the second memory cells in the first group in the first program stage and the second program stage are small, or a state difference between the programmed states reached by the second memory cells in the first group in the first program stage and the second program stage is small. For example, the first program stage is a coarse programming stage, and the second program stage is a fine programming stage, a voltage difference between the threshold voltages reached by the second memory cells in the first group in the coarse programming stage and the threshold voltage reached in the fine programming stage is small, or the state difference between the programmed state reached by the second memory cells in the first group in the coarse programming stage and the programmed state reached in the fine programming stage is small.

Operation 1303, if a first memory cell is coupled with a second memory cell in the second group through a second bit line, applying a first read voltage to the first memory cell at a second read duration.

In some examples, if the first memory cells coupled with the first selected word line are coupled with the second memory cells in the second group through the second bit line, it indicates that the first memory cells in the program stage are largely subjected to the interlayer interference from the second memory cells, such that when the first memory cells are read, the second read voltage is applied to the first memory cells at a preset second read duration.

The second memory cells in the second group are memory cells having relatively large interlayer interference to the first memory cells, that is, the voltage differences of the second memory cells in the second group in the first program stage and the second program stage are large, or a state difference between the programmed states reached by the second memory cells in the second group in the first program stage and the second program stage is large. For example, the first program stage is the coarse programming stage, and the second program stage is the fine programming stage, a voltage difference between the threshold voltages reached by the second memory cells in the second group in the coarse programming stage and the threshold voltage reached in the fine programming stage is large, or the state difference between the programmed state reached by the second memory cells in the second group in the coarse programming stage and the programmed state reached in the fine programming stage is large.

In some examples, according to the method provided by the examples of the present application, the plurality of second memory cells are grouped according to the voltage differences of the second memory cells in the first program stage and the second program stage, the second memory cells with small voltage differences are divided into the first group, the second memory cells with large voltage differences are divided into the second group, and the first memory cells coupled with the second memory cells in the first group are read through the corresponding first read duration and first read voltage when the read voltage is applied; and likewise, the first memory cells coupled with the second memory cells in the second group are read through the corresponding second read duration and second read voltage when the read voltage is applied, such that a reading accuracy rate of the first memory cells is increased.

According to the method provided by the examples of the present application, the grouping rule of the plurality of second memory cells is determined based on the program mode of the plurality of second memory cells, that is, grouping rules corresponding respectively to different program modes are preset, and according to the grouping rules, the second memory cells are grouped based on the erased state or programmed states corresponding to the second memory cells after the second program stage, such that the grouping efficiency of the second memory cells is improved.

According to the method provided by the examples of the present application, the plurality of second memory cells are grouped based on the voltage difference between the threshold voltages reached by the plurality of second memory cells in the first program stage and the second program stage, and the groups to which the second memory cells belong are determined according to a relationship between the voltage difference and the voltage difference threshold, such that a grouping accuracy rate of the second memory cells is increased.

In an example, the plurality of second memory cells may be grouped according to different methods. FIG. 15 shows an operation method of a memory provided by another example of the present application. The memory comprises a memory array and a peripheral circuit, wherein the memory array comprises memory cells; the memory cells comprise a plurality of first memory cells coupled with a first selected word line, and a plurality of second memory cells coupled with a second selected word line, wherein the first selected word line and the second selected word line are adjacent to each other in terms of word line distribution structure. As shown in FIG. 15, the operation method of a memory comprises the following operations. In an example, the following operations are performed and implemented by a peripheral circuit in the memory.

Operation 1501, performing a program operation on the plurality of second memory cells coupled with the second selected word line.

In some examples, when the program operation is performed on the plurality of second memory cells coupled with the second selected word line, a sequence in the program stages is as follows:

1) in the first program stage, a first program operation is performed on the plurality of first memory cells coupled with the first selected word line to obtain n programmed states;

2) in the first program stage, the first program operation is performed on the plurality of second memory cells coupled with the second selected word line to obtain n programmed states;

3) in the second program stage, a second program operation is performed on the plurality of first memory cells coupled with the first selected word line to obtain m programmed states, wherein n and m are positive integers, and n≤m; and the m programmed states are programmed states respectively reached by the plurality of first memory cells; and 4) in the second program stage, the second program operation is performed on the plurality of second memory cells coupled with the second selected word line to obtain m programmed states, wherein the m programmed states are programmed states respectively reached by the plurality of second memory cells.

It is to be noted that, an erased state and n programmed states are obtained after a first program operation is performed on the plurality of first memory cells or second memory cells in the above first program stage; and an erased state and m programmed states are obtained after the second program operation is performed on the plurality of first memory cells or second memory cells in the above second program stage.

In some examples, a program sequence of the first memory cells and the second memory cells is referred to the schematic diagram of the program stage sequence shown in FIG. 11, wherein WLn corresponds to the first selected word line, WLn+1 corresponds to the second selected word line, and since a spacing between the second selected word line and the first selected word line is small, the second program stage of the memory cells coupled with the second selected word line may produce interlayer interference to programmed results of the memory cells coupled with the first selected word line.

Operation 1502, determining a grouping rule of the plurality of second memory cells based on a program mode of the plurality of second memory cells, and grouping the plurality of second memory cells based on the grouping rule and the erased state or programmed states corresponding respectively to the plurality of second memory cells after the program operation, so as to obtain the grouping result.

Different program modes correspond to different grouping rules, and the program modes may be referred to the program modes shown in FIGS. 5 to 10. In the program mode shown in FIG. 5, the grouping rule is that: the second memory cells programmed to P0, P1, P2, P3, P4, P5, P12, and P13 in the second program stage are divided into the first group, and the second memory cells programmed to P6, P7, P8, P9, P10, P11, P14, and P15 in the second program stage are divided into the second group. In the program mode shown in FIG. 6, the grouping rule is that: the second memory cells programmed to P0, P1, P4, P5, P8, P9, P12, and P13 in the second program stage are divided into the first group, and the second memory cells programmed to P2, P3, P6, P7, P10, P11, P14, and P15 in the second program stage are divided into the second group. In the program mode shown in FIG. 7, the grouping rule is that: the second memory cells programmed to P0, P1, P3, P4, P6, P7, P10, and P11 in the second program stage are divided into the first group, and the second memory cells programmed to P2, P5, P8, P9, P12, P13, P14, and P15 in the second program stage are divided into the second group. In the program mode shown in FIG. 8, the grouping rule is that: the second memory cells programmed to P0, P1, P3, P4, P5, P6, P7, and P8 in the second program stage are divided into the first group, and the second memory cells programmed to P2, P9, P10, P11, P12, P13, P14, and P15 in the second program stage are divided into the second group. In the program mode shown in FIG. 9, the grouping rule is that: the second memory cells programmed to P0, P1, P2, P3, P4, P5, P9, and P10 in the second program stage are divided into the first group, and the second memory cells programmed to P6, P7, P8, P11, P12, P13, P14, and P15 in the second program stage are divided into the second group. In the program mode shown in FIG. 10, the grouping rule is that: the second memory cells programmed to P0, P1, P2, P3, P6, P7, P8, and P9 in the second program stage are divided into the first group, and the second memory cells programmed to P4, P5, P10, P11, P12, P13, P14, and P15 in the second program stage are divided into the second group.

After the programming of the plurality of second memory cells coupled with the second selected word line is completed, the groups to which various second memory cells belong are determined according to the erased state or programmed states corresponding respectively to the plurality of second memory cells.

Operation 1503, after performing the program operation on the plurality of second memory cells coupled with the second selected word line, reading the voltage differences of the plurality of second memory cells in the first program stage and the second program stage; and grouping the plurality of second memory cells based on the voltage differences corresponding respectively to the plurality of second memory cells, so as to obtain the grouping result.

In an example, when the voltage difference of a second memory cell in the first program stage and the second program stage is less than a voltage difference threshold, it is determined that the second memory cell belongs to the first group; or when the voltage difference of a second memory cell in the first program stage and the second program stage reaches the voltage difference threshold, it is determined that the second memory cell belongs to the second group. The voltage difference threshold is a preset numerical value.

In an example, a preset voltage difference threshold is 1v, and if a threshold voltage reached by the second memory cell after the first program stage is 0.3v, and a threshold voltage reached after the second program stage is 1.5v, the second memory cell is divided into the second group; and if the threshold voltage reached by the second memory cell after the first program stage is 0.3v, and the threshold voltage reached after the second program stage is 0.5v, the second memory cell is divided into the first group.

In some examples, after the grouping result of the plurality of second memory cells are acquired, the grouping result of the plurality of second memory cells are stored in a latch, and if a first memory cell is coupled with a second memory cell through the first bit line, the group to which the second memory cell belongs is acquired from the latch.

Operation 1504, if a first memory cell is coupled with a second memory cell in the first group through a first bit line, applying a first read voltage to the first memory cell at a first read duration.

In some examples, if the first memory cells coupled with a first selected word line are coupled with the second memory cells in the first group through the first bit line, it indicates that the first memory cells in the program stage are less subjected to the interlayer interference from the second memory cells, such that when the first memory cells are read, the first read voltage is applied to the first memory cells at a preset first read duration.

Operation 1505, if a first memory cell is coupled with a second memory cell in the second group through a second bit line, applying a first read voltage to the first memory cell at a second read duration.

In some examples, if the first memory cells coupled with the first selected word line are coupled with the second memory cells in the second group through the second bit line, it indicates that the first memory cells in the program stage are largely subjected to the interlayer interference from the second memory cells, such that when the first memory cells are read, the second read voltage is applied to the first memory cells at a preset second read duration.

In some examples, for the first read voltage, the first read duration, the second read voltage, and the second read duration, at least one of the following solutions is comprised:

In the first solution, the first read voltage and the second read voltage are the same, and the first read duration is shorter than the second read duration. That is, if a first memory cell is coupled with a second memory cell through a bit line, regardless of the second memory cell belonging to the first group or the second group, the same read voltage is employed for reading; however, if the second memory cell belongs to the first group, a shorter first read duration is employed for reading, and if the second memory cell belongs to the second group, a longer second read duration is employed for reading.

Figure 16:
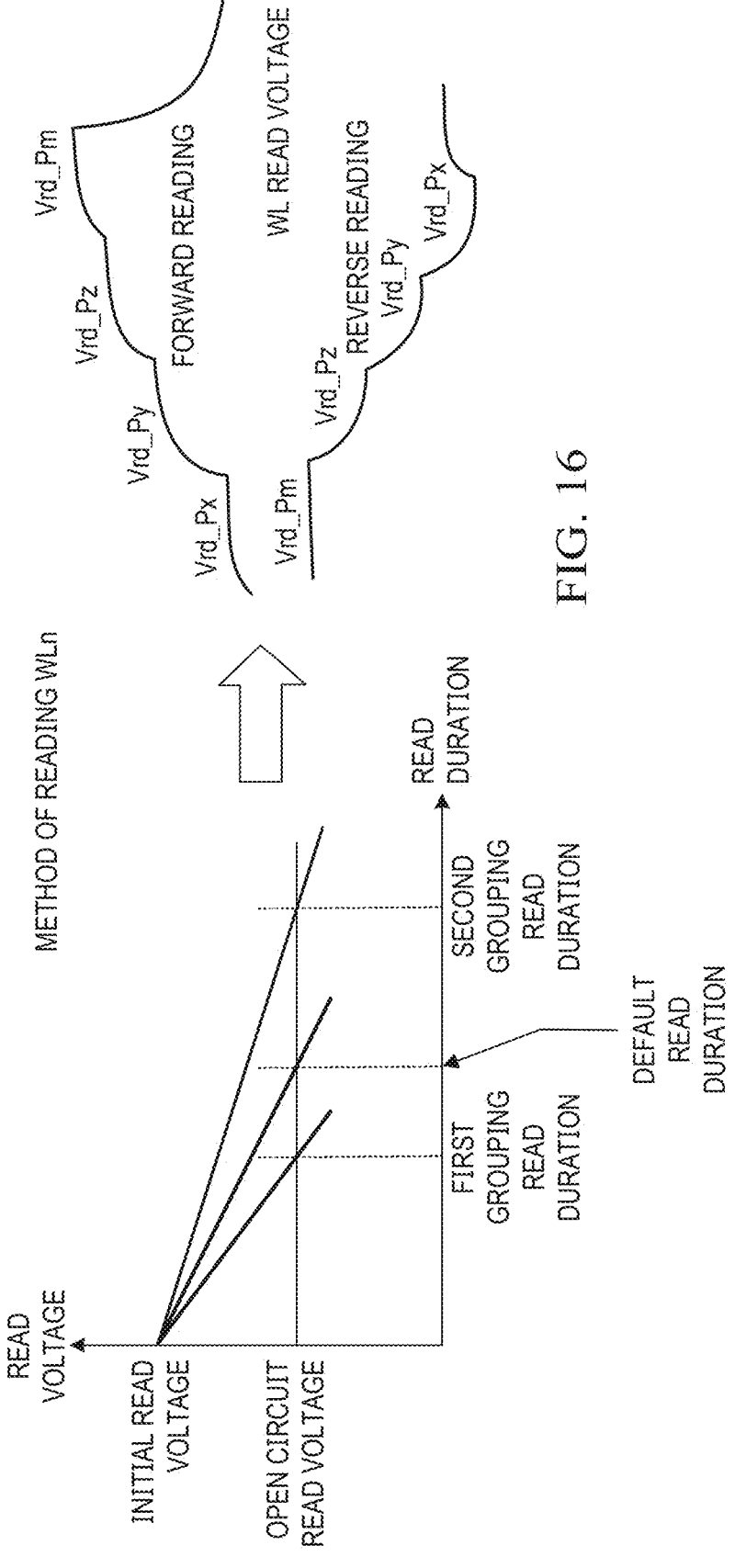
FIG. 16 is a schematic diagram of reading a selected word line provided based on the example shown in FIG. 15.

In an example, as shown in FIG. 16, for a first grouping read duration corresponding to the fact that the second memory cells coupled with the first memory cells belong to the first group, and for a second grouping read duration corresponding to the fact that the second memory cells coupled with the first memory cells belong to the second group, it is apparent that the first grouping read duration is shorter than the second grouping read duration, and the first memory cells corresponding to the first group and the first memory cells corresponding to the second group have a consistent read voltage.

In the second solution, the first read duration and the second read duration are the same; the first read voltage is a voltage that is obtained by performing a first offset operation between a reference voltage and a first offset voltage; and the second read voltage is a voltage that is obtained by performing a second offset operation between the reference voltage and a second offset voltage. Furthermore, the first read voltage is less than the second read voltage.

That is, if a first memory cell is coupled with a second memory cell through the bit line, regardless of the second memory cell belonging to the first group or the second group, the same read duration is employed for reading; however, if the second memory cell belongs to the first group, a smaller first read voltage is employed for reading, and if the second memory cell belongs to the second group, a larger second read voltage is employed for reading.

Figure 17:
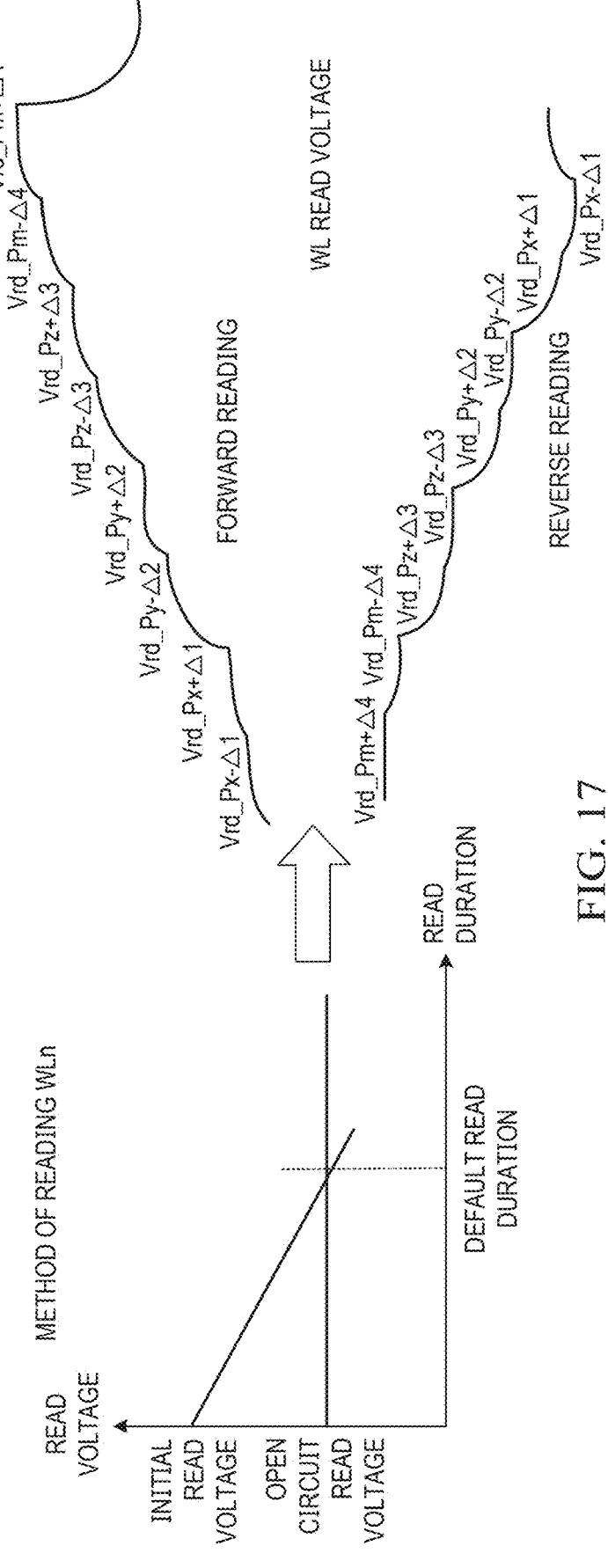
FIG. 17 is another schematic diagram of reading a selected word line provided based on the example shown in FIG. 15.

In some examples, the first offset voltage is the same as or different from the second offset voltage. In an example, the first offset operation may be a subtraction operation, and the second offset operation may be an addition operation; alternatively, the first offset operation may be a division operation, and the second offset operation may be a multiplication operation. This implementation is described by using an example that the first offset operation is the subtraction operation and the second offset operation is the addition operation. In an example, referring to FIG. 17, for the fact that the second memory cells coupled with the first memory cells belong to the first group, Vrd_Px-$\Delta$1, Vrd_Py-$\Delta$2, Vrd_Pz-$\Delta$3, and Vrd_Pm-$\Delta$4 are employed for reading, and for the fact that the second memory cells coupled with the first memory cells belong to the second group, Vrd_Px+$\Delta$1, Vrd_Py+$\Delta$2, Vrd_Pz+$\Delta$3, and Vrd_Pm+$\Delta$4 are employed for reading, it is apparent that the first read voltage is less than the second read voltage, and the first memory cells corresponding to the first group and the first memory cells corresponding to the second group have a consistent read duration.

In some examples, according to the method provided by the examples of the present application, the plurality of second memory cells are grouped according to the voltage differences of the second memory cells in the first program stage and the second program stage, the second memory cells with small voltage differences are divided into the first group, and the second memory cells with large voltage differences are divided into the second group. The first memory cells coupled with the second memory cells in the first group are read through the corresponding first read duration and first read voltage when the read voltage is applied; and likewise, the first memory cells coupled with the second memory cells in the second group are read through the corresponding second read duration and second read voltage when the read voltage is applied, such that a reading accuracy rate of the first memory cells is increased.

According to the method provided by the examples of the present application, the first memory cells corresponding to different groups are read by employing the same read voltage and different read durations, which is equivalent to increasing a threshold voltage width of the memory cells, thereby improving the programming reliability of the memory.

According to the method provided by the examples of the present application, the first memory cells corresponding to different groups are read by employing the same read duration and different read voltages, which is equivalent to increasing the threshold voltage width of the memory cells, thereby improving the programming reliability of the memory.

Figure 18:
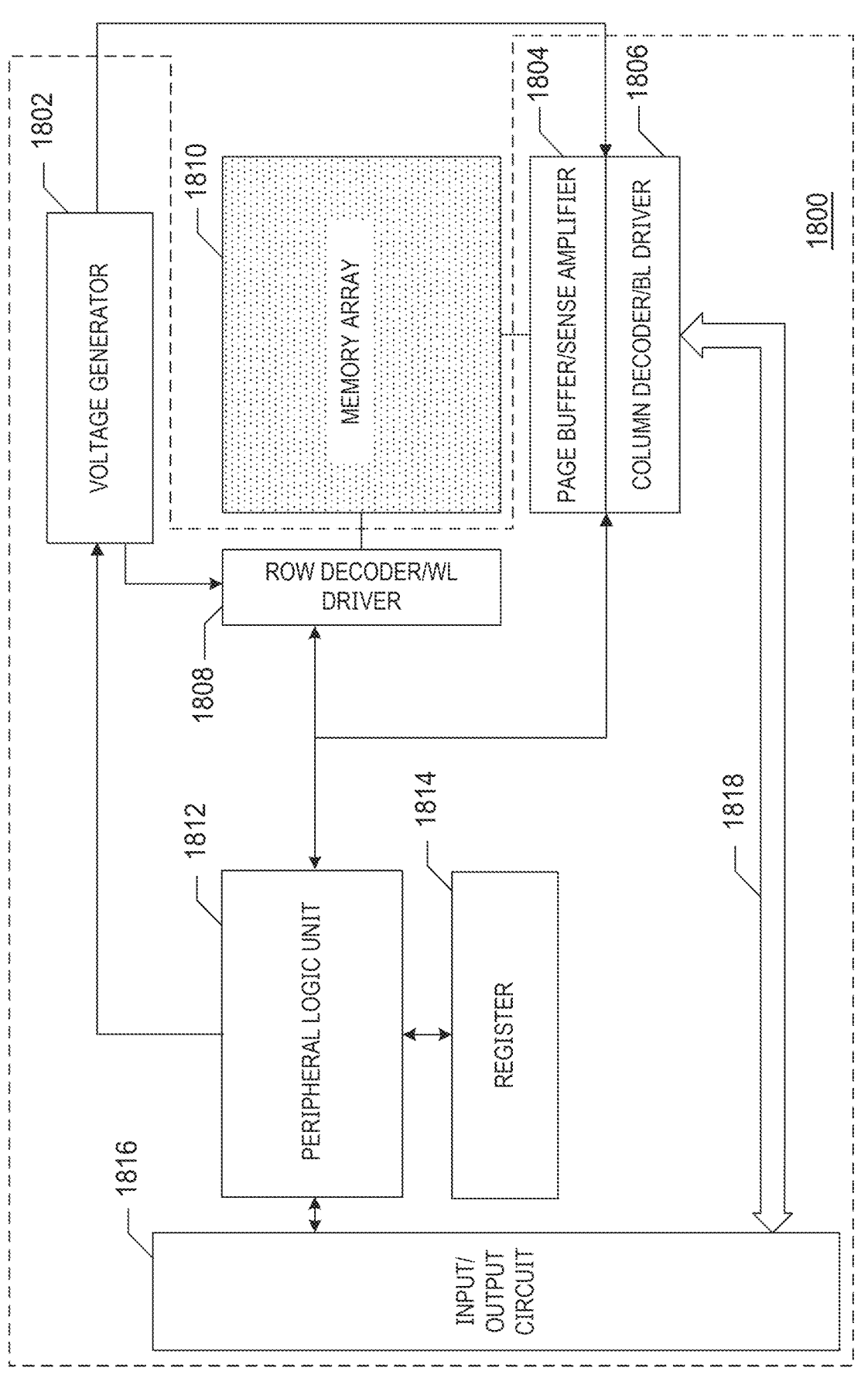
FIG. 18 is a schematic structural diagram of a memory provided by an example of the present application.

FIG. 18 is a schematic structural diagram of a memory provided by examples of the present application. As shown in FIG. 18, the memory comprises a peripheral circuit 1800 and a memory array 1810. In the examples of the present application, the memory further comprises a temperature sensor 1820.

The peripheral circuit 1800 is configured to write and read data to and from the memory array 1810.

The peripheral circuit 1800 comprise a voltage generator 1802, a page buffer/sense amplifier 1804, a column decoder/bit line (BL) driver 1806, a row decoder/word line (WL) driver 1808, a peripheral logic unit 1812, a register 1814, an input/output circuit 1816, and a data bus 1818. It is to be understood that, in some examples, additional peripheral circuits not shown in FIG. 18 may also be comprised as well.

The page buffer/sense amplifier 1804 may be configured to read and program (write) data from and to the memory cell array 1810 according to a control signal from the peripheral logic unit 1812. In one example, the page buffer/sense amplifier 1804 may store a page of program data (write data) to be programmed into a page in the memory cell array 1810. In another example, the page buffer/sense amplifier 1804 may execute a program verification operation to ensure that the data has been properly programmed into the memory cell coupled to the selected word line. In yet another example, the page buffer/sense amplifier 1804 may also sense a low power signal from the bit line that represents a data bit stored in the memory cell, and amplifies a small voltage swing to a recognizable logic level in the read operation.

The column decoder/bit line driver 1806 may be configured to be controlled by the peripheral logic unit 1812, and select one or more NAND memory strings by applying a bit line voltage generated from the voltage generator 1802.

The row decoder/word line driver 1808 may be configured to be controlled by the peripheral logic unit 1812, select/unselect blocks of the memory cell array 1810, and select/unselect word lines of the blocks. The row decoder/word line driver 1808 may further be configured to drive the word lines using a word line voltage (VWL) generated from the voltage generator 1802. In some implementations, the row decoder/word line driver 1808 may also select/unselect and drive source select gate lines and drain select gate lines. In an example, the row decoder/word line driver 1808 is configured to perform an erase operation on memory cells coupled to (one or more) selected word lines.

The voltage generator 1802 may be configured to be controlled by the peripheral logic unit 1812, and generate the word line voltage (such as, a read voltage, a program voltage, a pass voltage, a local voltage, a verify voltage, etc.), the bit line voltage, and a source line voltage, which are to be supplied to the memory cell array 1810.

The peripheral logic unit 1812 may be coupled to each peripheral circuit described above and configured to control operations of each peripheral circuit. The peripheral logic unit 1812 comprises the control circuit shown in FIG. 18 above.

The register 1814 may be coupled to the peripheral logic unit 1812 and comprise a state register, a command register, and an address register, so as to store state information, command operation code (OP code), and command address for controlling the operations of each peripheral circuit. The input/output circuit 1816 may be coupled to the peripheral logic unit 1812, and act as a control buffer to buffer and relay a control command received from a host (not shown) to the peripheral logic unit 1812, and to buffer and relay the state information received from the peripheral logic unit 1812 to the host. The input/output circuit 1816 may also be coupled to the column decoder/bit line driver 1806 via the data bus 1818 and act as a data input/output interface and a data buffer to buffer and relay the data to and from the memory cell array 1810.

The temperature sensor 1820 is configured to perform environment temperature collection, and output temperature sensing data to the peripheral circuit 1800. In some examples, an output end of the temperature sensor 1820 is connected with the input/output circuit 1816 of the peripheral circuit 1800, and the temperature sensing data is transmitted to the peripheral logic unit 1812 through the input/output circuit 1816.

In some examples, the temperature sensor 1820 may also be implemented as a part of the peripheral circuit 1800, and is connected with the peripheral logic unit 1812, so as to transmit the temperature sensing data to the peripheral logic unit 1812.

It is to be noted that, the peripheral circuit 1800 is configured to perform an operation method of a memory provided by examples of the present disclosure on selected memory cells in a plurality of memory cell rows.

Figure 19:
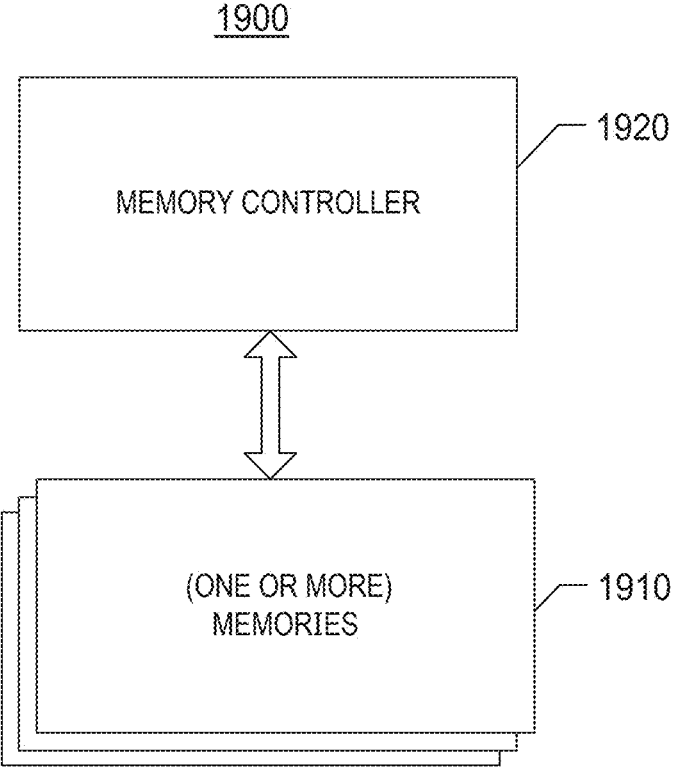
FIG. 19 is a schematic structural diagram of a memory system provided by an example of the present application.

FIG. 19 is a block structural diagram of a memory system provided by an example of the present application. As shown in FIG. 19, the memory system 1900 comprises: one or more memories 1910; and a memory controller 1920 coupled to the memory 1910 and configured to control the memory 1910.

The memory system 1900 may comprise a mobile phone, a desktop computer, a laptop computer, a tablet computer, a vehicle computer, a gaming console, a printer, a positioning apparatus, a wearable electronic apparatus, a smart sensor, a virtual reality (VR) apparatus, an augmented reality (AR) apparatus, or any other suitable electronic apparatus having a memory therein.

In an example, the memory system 1900 may comprise a host and a memory sub-system, wherein the memory sub-system is provided with one or more memories 1910 and a memory controller 1920. The host may be a processor of an electronic apparatus (such as a Central Processing Unit (CPU), or a system on chip (SoC) (such as an Application Processor (AP)). The host may be configured to send data to the memory 1910. Alternatively, the host may be configured to receive data from the memory 1910.

According to some implementations, the memory controller 1920 is further coupled to the host. The memory controller 1920 may manage data stored in the memory 1910, and communicate with the host.

In some implementations, the memory controller 1920 is designed for operating in a low duty-cycle environment, such as Secure Digital (SD) cards, Compact Flash (CF) Cards, Universal Serial Bus (USB) flash drives, or other media for use in electronic apparatuses, such as personal computers, digital cameras, mobile phones, etc.

In some implementations, the memory controller 1920 is designed for operating in a high duty-cycle environment of Solid State Disks (SSDs) or embedded Multi-Media Cards (eMMCs) used as data memories for mobile apparatuses, such as smartphones, tablets, laptop computers, etc., and enterprise memory arrays.

The memory controller 1920 may be configured to control operations of the memory 1910, such as read, erase, and program operations. The memory controller 1920 may further be configured to manage various functions with respect to data stored or to be stored in the memory 1910, including, but not limited to, bad-block management, garbage collection, logical-to-physical address conversion, wear leveling, etc. In some implementations, the memory controller 1920 is further configured to process error correction codes (ECCs) with respect to the data read from or written to the memory 1910.

The memory controller 1920 may further execute any other suitable functions, for example, formatting the memory 1910. The memory controller 1920 may communicate with an external apparatus according to a communication protocol.

The memory controller 1920 and the one or more memories 1910 may be integrated into various types of storage apparatuses, for example, be comprised in the same package (such as a Universal Flash Storage (UFS) package or an eMMC package). That is to say, the memory system 1900 may be implemented and packaged into different types of end electronic products.

In an example, the memory controller 1920 and the single memory 1910 may be integrated into a memory card. The memory card may comprise a personal computer memory card international association (PCMCIA, PC) card, a CF card, a Smart Media (SM) card, a memory stick, a multimedia card, an SD card, a UFS, etc. The memory card may further comprise a memory card connector coupling the memory card with the host.

In an example, the memory controller 1920 and the plurality of memories 1910 may be integrated into a solid state disk (SSD). In some implementations, a storage capacity and/or operation speed of the solid state disk is greater than a storage capacity and/or operation speed of the memory card.

It may be understood that, the memory controller 1920 may perform the operation method of a memory provided in any one of the examples of the present disclosure.

Examples of the present application provide a control circuit. The control circuit comprises at least one of a programmable logic circuit or program instructions. The control circuit may be configured to implement the operation method of a memory provided by the aforementioned examples of the present application. A program operation comprises a first program stage and a second program stage.

In an example, as shown in FIG. 18, the memory comprises the peripheral circuit 1800 and the memory array 1810, wherein the memory array comprises memory cells; the memory cells comprise a plurality of first memory cells coupled with a first selected word line, and a plurality of second memory cells coupled with a second selected word line, wherein the first selected word line and the second selected word line are adjacent to each other in terms of word line distribution structure; and the peripheral circuit 1800 is configured to: after performing a program operation on the plurality of second memory cells coupled with the second selected word line, acquire a grouping result of the plurality of second memory cells, wherein the grouping result comprises a first group and a second group, the program operation comprises a first program stage and a second program stage, and voltage differences of the second memory cells in the first group in the first program stage and the second program stage are less than voltage differences of the second memory cells in the second group in the first program stage and the second program stage;

if a first memory cell is coupled with a second memory cell in the first group through a first bit line, apply a first read voltage to the first memory cell at a first read duration; and if a first memory cell is coupled with a second memory cell in the second group through a second bit line, apply a second read voltage to the first memory cell at a second read duration.

In some examples, the peripheral circuit 1800 is further configured to:

determine a grouping rule of the plurality of second memory cells based on a program mode of the plurality of second memory cells, wherein the grouping rule comprises groups corresponding to an erased state and programmed states; and group the plurality of second memory cells based on the grouping rule and the erased state or programmed states corresponding respectively to the plurality of second memory cells after the program operation, so as to obtain the grouping result.

In some examples, the peripheral circuit 1800 is further configured to:

after performing the program operation on the plurality of second memory cells coupled with the second selected word line, read the erased state or programmed states corresponding respectively to the plurality of second memory cells; and group the plurality of second memory cells based on the erased state or programmed states corresponding respectively to the plurality of second memory cells and based on the groups corresponding to the erased state and each programmed state in the grouping rule, so as to obtain the grouping result.

In some examples, the peripheral circuit 1800 is further configured to:

after performing the program operation on the plurality of second memory cells coupled with the second selected word line, read the voltage differences of the plurality of second memory cells in the first program stage and the second program stage; and group the plurality of second memory cells based on the voltage differences corresponding respectively to the plurality of second memory cells, so as to obtain the grouping result.

In some examples, the peripheral circuit 1800 is further configured to:

when the voltage difference of a second memory cell in the first program stage and the second program stage is less than a voltage difference threshold, determine that the second memory cell belongs to the first group; or when the voltage difference of a second memory cell in the first program stage and the second program stage reaches the voltage difference threshold, determine that the second memory cell belongs to the second group.

In some examples, the first read duration is shorter than the second read duration, and the first read voltage and the second read voltage are the same; or the first read duration and the second read duration are the same; the first read voltage is a voltage that is obtained by performing a first offset operation between a reference voltage and a first offset voltage; the second read voltage is a voltage that is obtained by performing a second offset operation between the reference voltage and a second offset voltage; and the first read voltage is less than the second read voltage.

In some examples, the peripheral circuit 1800 is further configured to:

in the first program stage, perform a first program operation on the plurality of first memory cells coupled with the first selected word line to obtain n programmed states;

in the first program stage, perform the first program operation on the plurality of second memory cells coupled with the second selected word line to obtain n programmed states;

in the second program stage, perform a second program operation on the plurality of first memory cells coupled with the first selected word line to obtain m programmed states, wherein n and m are positive integers, and $n \leq m$; and in the second program stage, perform the second program operation on the plurality of second memory cells coupled with the second selected word line to obtain m programmed states.

In some examples, the peripheral circuit 1800 is further configured to:

store the grouping result of the plurality of second memory cells to a latch; and if a first memory cell is coupled with the second memory cells through the first bit line, acquire, from the latch, the group to which a second memory cell belongs.

Examples of the present application provide an electronic apparatus. The electronic device comprises:

one or more memories described in any one of the above-mentioned examples; and a memory controller coupled to the memory and configured to control the memory.

Examples of the present application provide a computer-readable storage medium. The computer-readable storage medium stores instructions, wherein the instructions, when running on a control circuit, implements the operation method of a memory provided by the aforementioned examples of the present application.

In the present application, the terms "first" and "second" are for descriptive purposes only, and cannot be construed as indicating or implying relative importance. The term "at least one" means one or more, and the term "a plurality of" means two or more, unless otherwise defined clearly.

The term "and/or" in the present application is merely an association relationship describing related objects, which means that there may be three relationships, for example, A and/or B may indicate three cases: A exists alone, both A and B exist, and B exists alone. In addition, the character "/" herein generally indicates that the related objects are in an "or" relationship.

The above are only examples of the present application, and are not used to limit the present application. Any modifications, equivalent replacements and improvements and the like made within the spirit and principle of the disclosure shall be included within the scope of protection of the present application.

What is claimed is:

1. A memory, comprising:
a memory array comprising:
memory cells comprising:
    a plurality of first memory cells coupled with a first selected word line, and
    a plurality of second memory cells coupled with a second selected word line,
    wherein the first selected word line and the second selected word line are adjacent to each other in terms of word line distribution structure; and
a peripheral circuit configured to:
    after performing a program operation on the plurality of second memory cells coupled with the second selected word line, acquire a grouping result of the plurality of second memory cells, wherein the grouping result comprises a first group and a second group, the program operation comprises a first program stage and a second program stage, and voltage differences of the second memory cells in the first group in the first program stage and the second program stage are less than voltage differences of the second memory cells in the second group in the first program stage and the second program stage;
    if a first memory cell is coupled with a second memory cell in the first group through a first bit line, apply a first read voltage to the first memory cell at a first read duration; and
    if a first memory cell is coupled with a second memory cell in the second group through a second bit line, apply a second read voltage to the first memory cell at a second read duration.

2. The memory of claim 1, wherein the peripheral circuit is further configured to:
determine a grouping rule of the plurality of second memory cells based on a program mode of the plurality of second memory cells, wherein the grouping rule comprises groups corresponding to an erased state and programmed states; and
group the plurality of second memory cells based on the grouping rule and the erased state or programmed states corresponding respectively to the plurality of second memory cells after the program operation, so as to obtain the grouping result.

3. The memory of claim 2, wherein the peripheral circuit is further configured to:
after performing the program operation on the plurality of second memory cells coupled with the second selected word line, read the erased state or programmed states corresponding respectively to the plurality of second memory cells; and
group the plurality of second memory cells based on the erased state or programmed states corresponding respectively to the plurality of second memory cells and based on the groups corresponding to the erased state and each programmed state in the grouping rule, so as to obtain the grouping result.

4. The memory of claim 1, wherein the peripheral circuit is further configured to:
after performing the program operation on the plurality of second memory cells coupled with the second selected word line, read the voltage differences of the plurality of second memory cells in the first program stage and the second program stage; and
group the plurality of second memory cells based on the voltage differences corresponding respectively to the plurality of second memory cells, so as to obtain the grouping result.

5. The memory of claim 4, wherein the peripheral circuit is further configured to:
when the voltage difference of a second memory cell in the first program stage and the second program stage is less than a voltage difference threshold, determine that the second memory cell belongs to the first group; or
when the voltage difference of a second memory cell in the first program stage and the second program stage reaches the voltage difference threshold, determine that the second memory cell belongs to the second group.

6. The memory of claim 1, wherein
the first read duration is shorter than the second read duration, and the first read voltage and the second read voltage are the same; or
the first read duration and the second read duration are the same; the first read voltage is a voltage that is obtained by performing a first offset operation between a reference voltage and a first offset voltage; the second read voltage is a voltage that is obtained by performing a second offset operation between the reference voltage and a second offset voltage; and the first read voltage is less than the second read voltage.

7. The memory of claim 1, wherein the peripheral circuit is further configured to:
in the first program stage, perform a first program operation on the plurality of first memory cells coupled with the first selected word line to obtain n programmed states;
in the first program stage, perform the first program operation on the plurality of second memory cells coupled with the second selected word line to obtain n programmed states;
in the second program stage, perform a second program operation on the plurality of first memory cells coupled with the first selected word line to obtain m programmed states, wherein n and m are positive integers, and n≤m; and in the second program stage, perform the second program operation on the plurality of second memory cells coupled with the second selected word line to obtain m programmed states.

8. The memory of claim 1, wherein the peripheral circuit is further configured to:

store the grouping result of the plurality of second memory cells to a latch; and if a first memory cell is coupled with a second memory cell through the first bit line, acquire, from the latch, a group to which the second memory cell belongs.

9. An operation method of a memory, wherein the memory comprises a plurality of first memory cells coupled with a first selected word line, and a plurality of second memory cells coupled with a second selected word line, wherein the first selected word line and the second selected word line are adjacent to each other in terms of word line distribution structure; and the method comprises:

after performing a program operation on the plurality of second memory cells, acquiring a grouping result of the plurality of second memory cells, wherein the grouping result comprises a first group and a second group, the program operation comprises a first program stage and a second program stage, and voltage differences of the second memory cells in the first group in the first program stage and the second program stage are less than voltage differences of the second memory cells in the second group in the first program stage and the second program stage; and if a first memory cell is coupled with a second memory cell in the first group through a first bit line, applying a first read voltage to the first memory cell at a first read duration; or if a first memory cell is coupled with a second memory cell in the second group through a second bit line, applying a second read voltage to the first memory cell at a second read duration.

10. The method of claim 9, wherein the acquiring the grouping result of the plurality of second memory cells comprises:

determining a grouping rule of the plurality of second memory cells based on a program mode of the plurality of second memory cells, wherein the grouping rule comprises groups corresponding to an erased state and programmed states; and grouping the plurality of second memory cells based on the grouping rule and the erased state or programmed states corresponding respectively to the plurality of second memory cells after the program operation, so as to obtain the grouping result.

11. The method of claim 10, wherein the grouping the plurality of second memory cells based on the grouping rule and the erased state or programmed states corresponding respectively to the plurality of second memory cells after the program operation, so as to obtain the grouping result comprises:

after performing the program operation on the plurality of second memory cells coupled with the second selected word line, reading the erased state or programmed states corresponding respectively to the plurality of second memory cells; and grouping the plurality of second memory cells based on the erased state or programmed states corresponding respectively to the plurality of second memory cells and based on the groups corresponding to the erased state and each programmed state in the grouping rule, so as to obtain the grouping result.

12. The method of claim 9, wherein the acquiring the grouping result of the plurality of second memory cells comprises:

after performing the program operation on the plurality of second memory cells coupled with the second selected word line, reading the voltage differences of the plurality of second memory cells in the first program stage and the second program stage; and grouping the plurality of second memory cells based on the voltage differences corresponding respectively to the plurality of second memory cells, so as to obtain the grouping result.

13. The method of claim 12, wherein the grouping the plurality of second memory cells based on the voltage differences corresponding respectively to the plurality of second memory cells, so as to obtain the grouping result comprises:

when the voltage difference of a second memory cell in the first program stage and the second program stage is less than a voltage difference threshold, determining that the second memory cell belongs to the first group; or when the voltage difference of a second memory cell in the first program stage and the second program stage reaches the voltage difference threshold, determining that the second memory cell belongs to the second group.

14. The method of claim 9, wherein the first read duration is shorter than the second read duration, and the first read voltage and the second read voltage are the same; or the first read duration and the second read duration are the same; the first read voltage is a voltage that is obtained by performing a first offset operation between a reference voltage and a first offset voltage; and the second read voltage is a voltage that is obtained by performing a second offset operation between the reference voltage and a second offset voltage.

15. The method of claim 9, wherein the first program stage comprises a first program operation, and the second program stage comprises a second program operation; and the method further comprises:

performing the first program operation on the plurality of first memory cells coupled with the first selected word line to obtain n programmed states;

performing the first program operation on the plurality of second memory cells coupled with the second selected word line to obtain n programmed states;

performing the second program operation on the plurality of first memory cells coupled with the first selected word line to obtain m programmed states, wherein n and m are positive integers, and n≤m; and performing the second program operation on the plurality of second memory cells coupled with the second selected word line to obtain m programmed states.

16. The method of claim 9, further comprising:

storing the grouping result of the plurality of second memory cells to a latch; and if a first memory cell is coupled with a second memory cell through the first bit line, acquiring, from the latch, a group to which the second memory cell belongs.

17. A memory system, comprising:

one or more memories each comprising:

a memory array comprising:

US 12,620,441 B2 memory cells comprising:

a plurality of first memory cells coupled with a first selected word line, and a plurality of second memory cells coupled with a second selected word line, wherein the first selected word line and the second selected word line are adjacent to each other in terms of word line distribution structure; and a peripheral circuit configured to:

after performing a program operation on the plurality of second memory cells coupled with the second selected word line, acquire a grouping result of the plurality of second memory cells, wherein the grouping result comprises a first group and a second group, the program operation comprises a first program stage and a second program stage, and voltage differences of the second memory cells in the first group in the first program stage and the second program stage are less than voltage differences of the second memory cells in the second group in the first program stage and the second program stage;

if a first memory cell is coupled with a second memory cell in the first group through a first bit line, apply a first read voltage to the first memory cell at a first read duration; and if a first memory cell is coupled with a second memory cell in the second group through a second bit line, apply a second read voltage to the first memory cell at a second read duration; and a memory controller coupled to the memories and configured to control the memories.

18. The memory system of claim 17, wherein the peripheral circuit is further configured to:

determine a grouping rule of the plurality of second memory cells based on a program mode of the plurality of second memory cells, wherein the grouping rule comprises groups corresponding to an erased state and programmed states; and group the plurality of second memory cells based on the grouping rule and the erased state or programmed states corresponding respectively to the plurality of second memory cells after the program operation, so as to obtain the grouping result.

19. The memory system of claim 18, wherein the peripheral circuit is further configured to:

after performing the program operation on the plurality of second memory cells coupled with the second selected word line, read the erased state or programmed states corresponding respectively to the plurality of second memory cells; and group the plurality of second memory cells based on the erased state or programmed states corresponding respectively to the plurality of second memory cells and based on the groups corresponding to the erased state and each programmed state in the grouping rule, so as to obtain the grouping result.

20. The memory system of claim 17, wherein the peripheral circuit is further configured to:

after performing the program operation on the plurality of second memory cells coupled with the second selected word line, read the voltage differences of the plurality of second memory cells in the first program stage and the second program stage; and group the plurality of second memory cells based on the voltage differences corresponding respectively to the plurality of second memory cells, so as to obtain the grouping result.

* * * * *